United States Patent [19]
Yamauchi

[11] Patent Number: 5,338,952
[45] Date of Patent: Aug. 16, 1994

[54] NON-VOLATILE MEMORY

[75] Inventor: Yoshimitsu Yamauchi, Yamatokoriyama, Japan

[73] Assignee: Sharp Kabushiki Kaisha, Osaka, Japan

[21] Appl. No.: 120,320

[22] Filed: Sep. 13, 1993

Related U.S. Application Data

[63] Continuation of Ser. No. 851,558, Mar. 13, 1992, abandoned, which is a continuation-in-part of Ser. No. 744,509, Aug. 14, 1991, abandoned.

[30] Foreign Application Priority Data

Jun. 7, 1991 [JP] Japan .................................. 3-136800
Jul. 30, 1991 [JP] Japan .................................. 3-214532

[51] Int. Cl.⁵ .......................................... H01L 29/68
[52] U.S. Cl. .................................... 257/315; 257/316; 257/319; 257/321; 257/390; 257/903
[58] Field of Search ............... 357/23.5; 257/315, 316, 257/319, 321, 390, 903

[56] References Cited

U.S. PATENT DOCUMENTS

| | | | |
|---|---|---|---|
| 4,616,340 | 10/1986 | Hayashi et al. | 365/185 |
| 4,754,320 | 6/1988 | Mizutani et al. | 357/23.5 |
| 4,882,707 | 11/1989 | Mizutani | 365/185 |
| 5,027,185 | 6/1991 | Liauh | 357/59 |
| 5,041,886 | 8/1991 | Lee | 357/23.5 |
| 5,051,793 | 9/1991 | Wang | 357/23.5 |

FOREIGN PATENT DOCUMENTS

| | | | |
|---|---|---|---|
| 62-230058 | 10/1987 | Japan | 357/23.5 |
| 63-045865 | 2/1988 | Japan | 357/23.5 |

Primary Examiner—Edward Wojciechowicz
Attorney, Agent, or Firm—Nixon & Vanderhye

[57] ABSTRACT

A non-volatile memory having a memory cell, the memory cell including a semiconductor substrate having first and second impurity diffusion layers, a first insulating film provided on the semiconductor substrate between the first and second impurity diffusion layers and on the first impurity diffusion layer side, a tunnel dielectric film extended to a second impurity diffusion layer region which is provided opposite to the first impurity diffusion layer side, a first electrode formed on the first insulating film, a floating gate formed on the tunnel dielectric film and on the side wall of the first electrode through an insulating film, and a second electrode provided at least on the floating gate through a second insulating film so as to control the potential of the floating gate, wherein channel hot electrons can be injected from the inversion layer formed under the first electrode, which is controlled by the first electrode, to the floating gate.

50 Claims, 25 Drawing Sheets

NON-VOLATILE MEMORY

This is a continuation of application Ser. No. 07/851,558, Mar. 13, 1992, now abandoned which is a continuation-in-part of U.S. application Ser. No. 07/744,509, filed Aug. 14, 1991, now abandoned.

BACKGROUND OF THE INVENTION

1. Field of the Invention

The present invention relates to a non-volatile memory with high integration, and more particularly to a source—side injection of hot electron type FLASH EEPROM in which writing can be performed at a single supply voltage of 5 V or less.

2. Description of the Prior Art

Conventionally, there has been provided a FLASH EEPROM in which writing is performed by channel hot electron injection from the drain side of a single transistor. Consequently, a writing current of about 1 mA is needed. In addition, a writing efficiency is low so that it is necessary to apply a high voltage more than 5 V to a drain. Accordingly, it is difficult to generate an on-chip high voltage. Therefore, there is needed an extra external supply higher voltage except a normal 5 V supply voltage.

It is an object of the present invention to provide a non-volatile memory in which the writing efficiency is enhanced so that the writing can be performed at a single supply voltage of 5 V or less and at a speed of 1 μs or less, a single power source is quite enough. Or, the present invention cell makes it possible to realize the shrinkable small area. Referring to the prior art, a memory cell has a programming current of 1 mA. Referring to the present invention, the memory cell has a programming current of 10 μA. Consequently, an on-chip high voltage generation circuit can easily be designed.

SUMMARY OF THE INVENTION

The present invention provides a non-volatile memory having a memory cell, the memory cell comprising a semiconductor substrate having first and second impurity diffusion layers, a first insulating film provided on the semiconductor substrate between the first and second impurity diffusion layers and on the first impurity diffusion layer side, a tunnel dielectric film extended to a second impurity diffusion layer region which is provided opposite to the first impurity diffusion layer side, a first electrode formed on the first insulating film, a floating gate formed on the tunnel dielectric film and on the side wall of the first electrode through an insulating film, and a second electrode provided at least on the floating gate through a second insulating film so as to control the potential of the floating gate, wherein channel hot electrons can be injected from the inversion layer formed under the first electrode, which is controlled by the first electrode, to the floating gate.

From another aspect, the present invention provides a non-volatile memory
  (i) wherein a plurality of memory cells are continuously provided in one direction and the first and second impurity diffusion layers of the adjacent memory cells are continuously formed,
  (ii) wherein a plurality of memory cells are continuously provided in one direction, three adjacent memory cells are treated as a unit, the first impurity diffusion layers of one pair of adjacent memory cells are commonly provided, and the second impurity diffusion layers of the other pair of adjacent memory cells are commonly provided, and
  (iii) wherein a plurality of memory cells are arranged in a matrix,
the memory cells are arranged in a matrix in the direction of Y and have first electrodes connected to one another in the direction of Y, the memory cells are arranged in a matrix in the direction of X and have the adjacent first impurity diffusion layers commonly formed and the adjacent second impurity diffusion layers continuously formed, one of the first and second impurity diffusion layers is connected in the direction of X, and the other impurity diffusion layer is connected in the direction of Y.

DETAILED DESCRIPTION OF PREFERRED EMBODIMENTS

The present invention provides a FLASH EEPROM comprising a first electrode formed on a first insulating film, and a second electrode for at least covering a floating gate to be controlled, the floating gate being obtained by forming polysilicon side wall spacers on a tunnel dielectric film so as to be self-aligned with the first electrode, so that channel hot electrons can be injected from the inversion layer formed under the first electrode, which is controlled by the first electrode, to the floating gate.

A first impurity diffusion layer of a memory cell according to the present invention is a source region.

A second impurity diffusion layer of the memory cell according to the present invention is a drain region.

The first insulating film according to the present invention is a gate oxide film of the first electrode, for example, a $SiO_2$ film and has a thickness of about 50 to 200 Å.

The tunnel dielectric film is extended to a second impurity diffusion layer region which is provided opposite to the first impurity diffusion layer.

The tunnel dielectric film according to the present invention is a tunnel insulating film provided under the floating gate, for example, a $SiO_2$ film and has a thickness of about 20 to 100 Å.

Preferred embodiments of the present invention will be described below. The present invention is not limited to the following embodiments.

Figure 1:
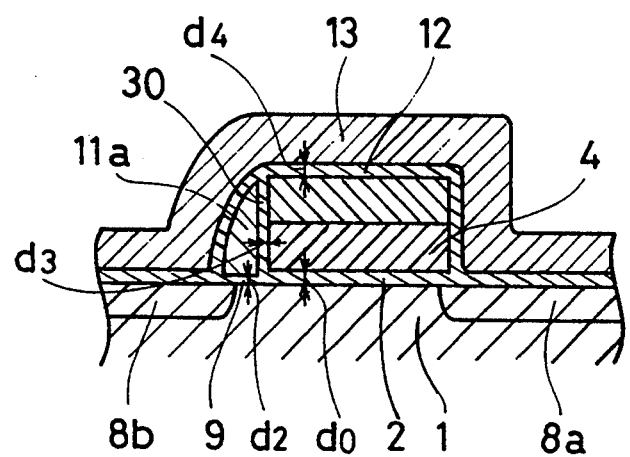
FIG. 1 is a view for explaining the structure of a memory cell according to the present invention.

FIG. 1 shows a memory cell of a non-volatile memory according to an embodiment of the present invention.

In FIG. 1, the non-volatile memory comprises a p-type Si substrate 1 having an n+ diffusion layer 8a as a source and an n+diffusion layer 8b as a drain, a first insulating film as a $SiO_2$ gate oxide film 2, a tunnel dielectric film as a $SiO_2$ tunnel insulating film 9, a first electrode as an auxiliary gate (AG) 4, a floating gate 11a, and a second electrode as a control gate (CG) 13. The first insulating film 2 is provided between the source 8a and the drain 8b, and has a thickness d0 of 170 Å. The tunnel dielectric film 9 is extended to the drain 8b which is provided opposite to the source 8a, and has a thickness d2 of 80 Å. The AG 4 is formed on the first insulating film 2 for injecting hot electrons from the source-side of the floating gate so as to perform writing. The floating gate 11a is formed on the tunnel dielectric film 9 and on the side wall of the first electrode 4 through an insulating film (which has a thickness d3 of 500 Å) 30. The CG 13 is provided at least on the floating gate 11a through a $SiO_2$ film (second insulating film) 12 having a thickness d4 of 200 Å so as to control the potential of the floating gate 11a.

A manufacturing method will be described below.

Figure 3A:
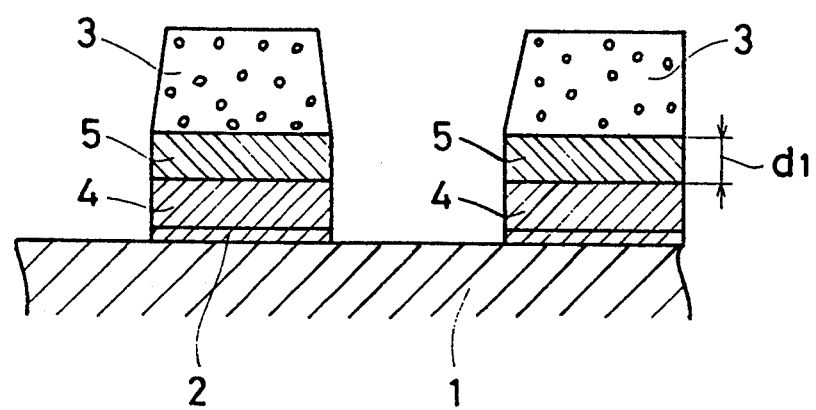
FIGS. 3(a)-3(e) are views for explaining steps of manufacturing the memory cell.
Figure 3:
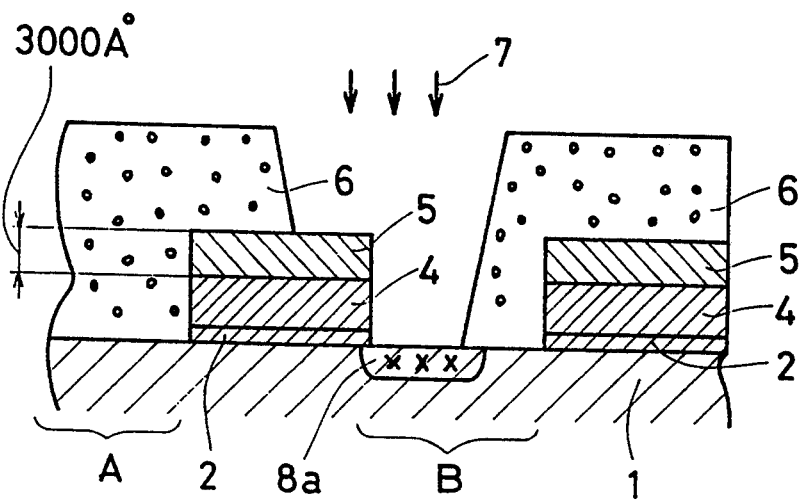
Figure 3:
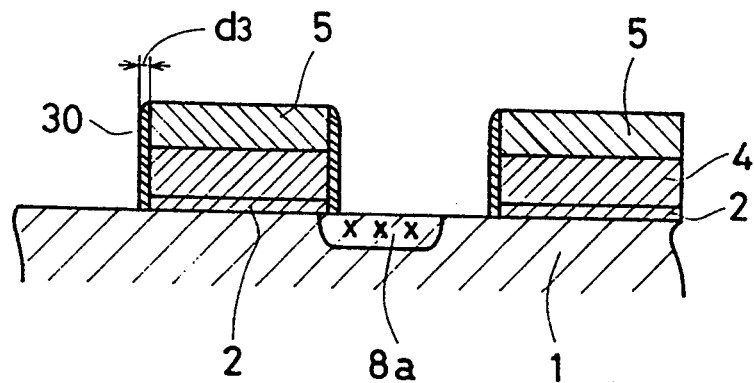
Figure 3:
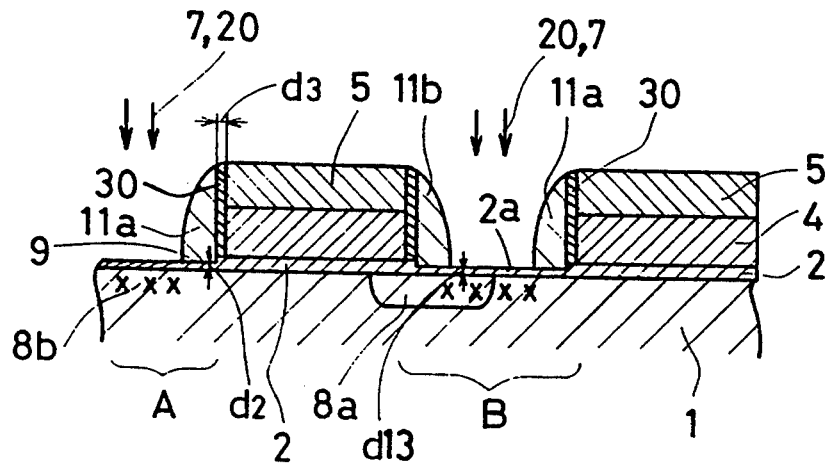
Figure 3E:
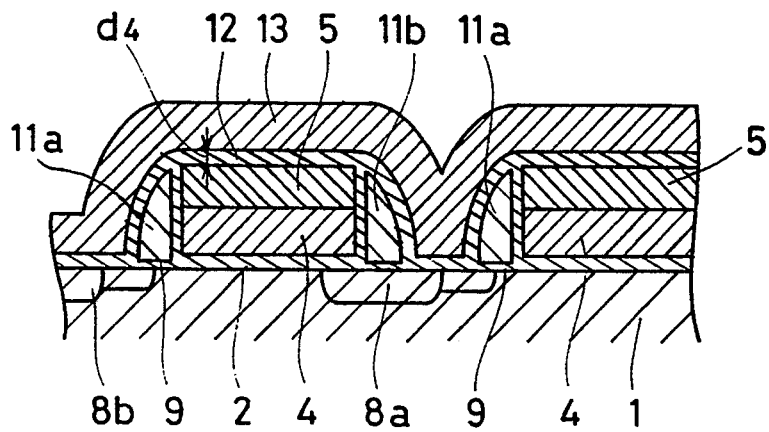

As shown in FIG. 3 (a), a $SiO_2$ gate oxide film 2 having a thickness of 170 Å is formed as a first insulating film on a p-type Si substrate 1 by thermal oxidation. Then, a polysilicon layer having a thickness of 3000 Å and a $SiO_2$ film having a thickness d1 of 1500 Å are sequentially laminated on the whole surface of the gate oxide film 2. Thereafter, a resist pattern 3 is laminated at a thickness of, for example, 1 μm. Subsequently, etching is carried out to form an auxiliary gate (AG) 4 and a $SiO_2$ film 5 [see FIG. 3 (a)].

After the resist pattern 3 is removed, an ion implantation mask 6 is formed. Then, As ions 7 are implanted by using the ion implantation mask 6 and AG 4 as masks [see FIG. 3 (b)]. Consequently, an n+ diffusion layer 8a as a source is formed on one B of two n+ diffusion layer formation regions A, B of the AG 4. In this case, a quantity of ion implantation is $1 \times 10^{15}$ cm$^{-2}$ at an accelerating voltage of 80 KeV.

After the mask 6 is removed, a $SiO_2$ insulating film having a thickness of 500 Å (not shown) is laminated on the whole surface of the Si substrate 1 having the AG 4. Then, $SiO_2$ side wall insulating films 30 having a thickness d3 of 500 Å are formed on the side walls of the AG 4 by etchback [see FIG. 3 (c)]. The side wall insulating film 30 may be a two-layer film such as a $SiO_2/SiN$ film, or a three-layer film such as a $SiO_2/SiN/SiO_2$ film (ONO film).

Then, thermal oxidation is carried out to form a tunnel dielectric film as a $SiO_2$ tunnel insulating film 9 having a thickness d2 of 80 Å in a region A and a $SiO_2$-film 2a having a thickness d13 of 150 Å in a region B in accordance with the difference between oxide film forming speeds corresponding to the difference between impurity densities on the Si substrate 1 in the regions A and B [see FIG. 3 (d)]. Then, a polysilicon layer having a thickness of 4000 Å is laminated on the whole surface of the Si substrate 1 having the side wall insulating films 30. Then, etchback is carried out by normal Reactive Ion Etching (RIE) so as to form polysilicon side wall spacers 11a and 11b on the side walls of the AG 4 [see FIG. 3 (d)].

In this case, the side wall 11a is provided on the n+ diffusion layer side (drain 8b to be formed in a next step) opposite to the n+ diffusion layer 8a of the AG 4. In addition, the side wall 11a is formed on the $SiO_2$ tunnel insulating film 9 having a thickness of 80 Å and functions as a floating gate (FG). On the other hand, the side wall 11b is not related to the operation of the memory cell. Accordingly, the side wall 11b may be removed by RIE.

Then, As ions 7 and P ions 20 are implanted in the Si substrate 1 again so as to form the n+ diffusion layer 8b as a drain in the residual n+ diffusion layer formation region A [see FIG. 3 (d)]. In this case, quantities of the As and P ions to be implanted are $5 \times 10^{14}$ cm$^{-2}$ and $2 \times 10^{14}$ cm$^{-2}$, respectively.

Subsequently, a $SiO_2$ film 12 having a thickness d4 of 200 Å is formed on the whole surface of the Si substrate 1 having the source 8a, drain 8b and side wall insulating films 30. Then, a polysilicon layer having a thickness of 2000 Å is laminated on the $SiO_2$ film 12. Thereafter, etching is carried out by using a resist mask (not shown) so as to form a control gate (CG) 13 [see FIG. 3 (e)].

Figure 2:
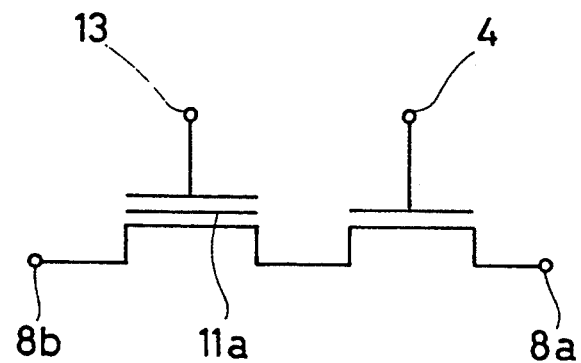
FIG. 2 is an equivalent circuit diagram showing the memory cell.

FIG. 2 shows an equivalent circuit of the memory cell according to the present embodiment.

In the equivalent circuit shown in FIG. 2, voltages to be applied to the source 8a, drain 8b, AG 4 and CG 13 are represented by Vs, Vd, Vag and Vcg, respectively. By way of example, if the voltages shown in Table 1 are applied, the memory cell can be operated.

TABLE 1

|  | Vs | Vd | Vcg | Vag |
| --- | --- | --- | --- | --- |
| WRITE | 0 | 5 V | 12 V | 2 V |
| ERASE | 0 | 5 V | −11 V | 0 |
| READ | 0 | 2 V | 5 V | 5 V |

In Table 1, a high voltage is applied to the CG 13 so that a portion just under the FG 11a is held in the state of strength inversion at the time of writing. When a voltage of about Vth is applied to the AG 4, hot electrons are injected from a source-side of the floating gate to the FG 11a.

At the time of erasing, the electrons are pulled out by an F/N tunnel current flowing from the FG 11a to the drain 8b.

Figure 4:
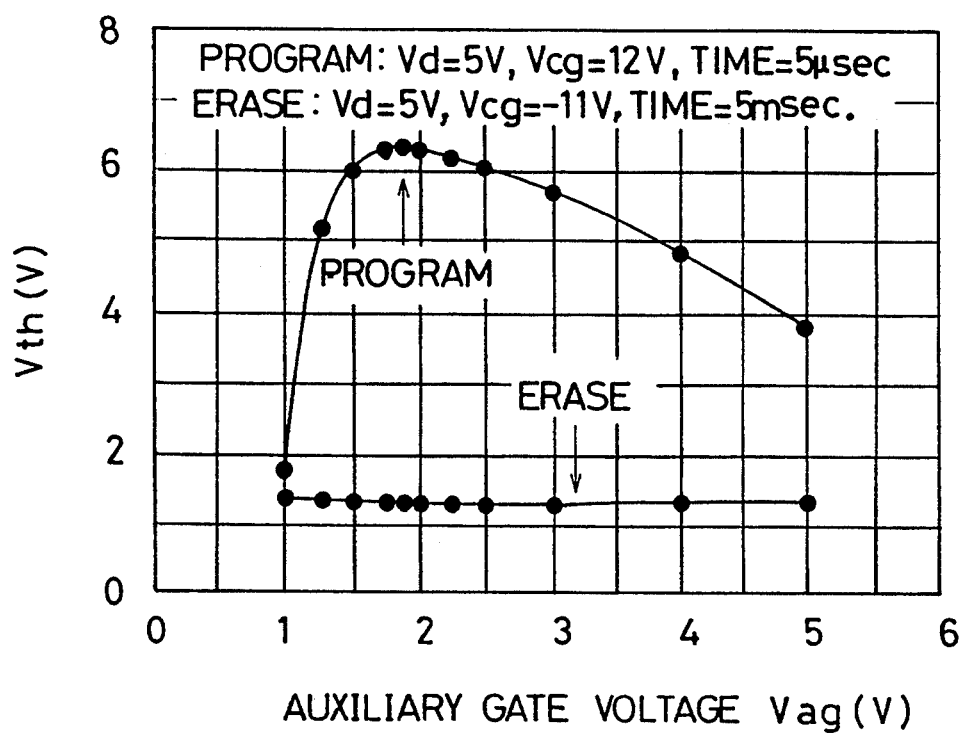
FIG. 4 is a characteristic chart showing the relationship between an auxiliary gate voltage (Vag) and a threshold voltage (Vth) during programming and erasing of the memory cell.

FIG. 4 shows a threshold voltage Vth of the programmed memory cell as a function of an AG voltage Vag.

Figure 5:
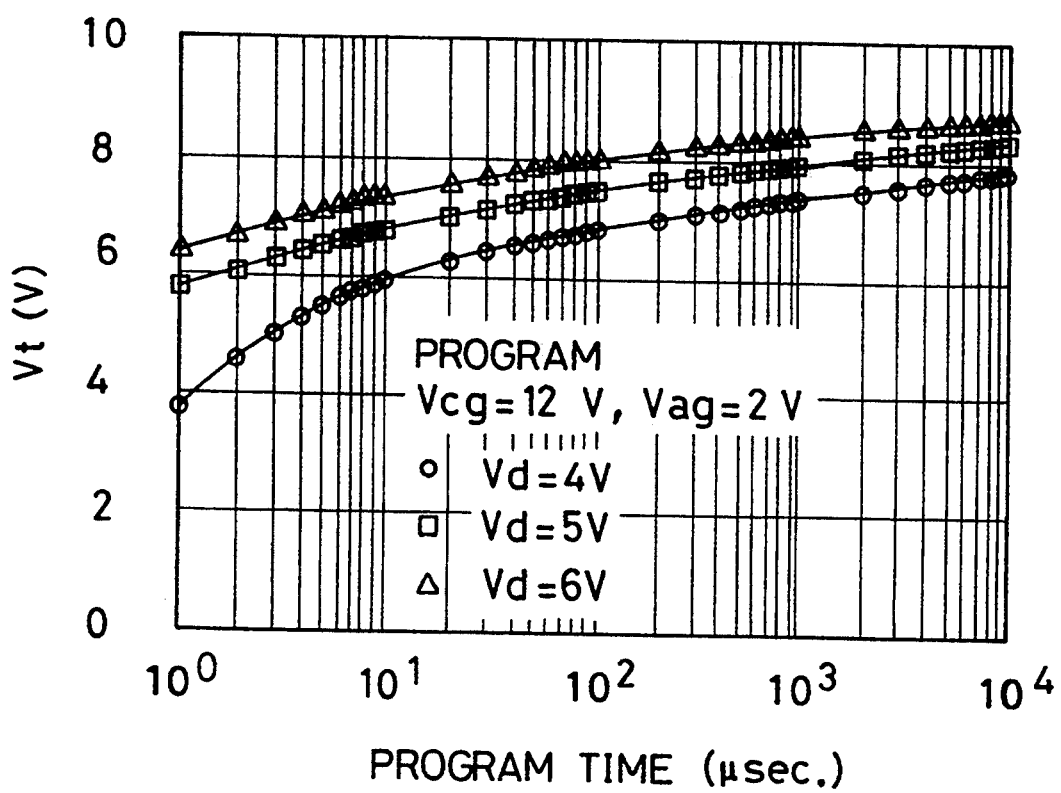
FIG. 5 is a characteristic chart showing the relationship between a threshold voltage (Vt) and a program time during the programming of the memory cell.

FIG. 5 shows a threshold shift of the programmed memory cell as a function of programming time for different voltages.

Figure 6:
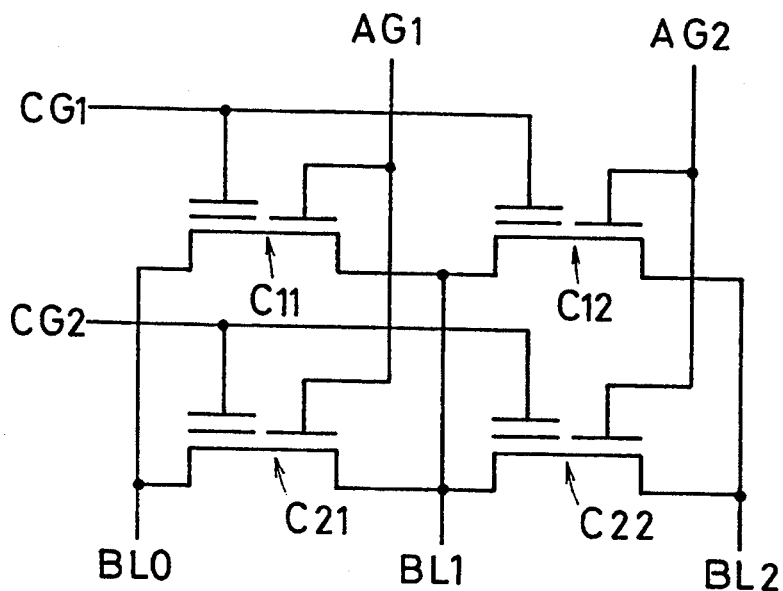
FIG. 6 is an equivalent circuit diagram showing a memory cell array according to a first embodiment of the present invention.

FIG. 6 shows a memory cell array according to a first embodiment of the present invention in which a plurality of memory cells are arranged. The memory cells are provided in one direction such that source and drain regions of the respective adjacent memory cells are continuously formed. AGs are continuously formed in the direction orthogonal to the above-mentioned one direction of memory cells. The source and drain regions are connected to one another in parallel with the direction in which the AGs are connected to one another.

In FIG. 6, the source and drain of adjacent memory cells C11 and C12 are connected to each other.

Figure 7:
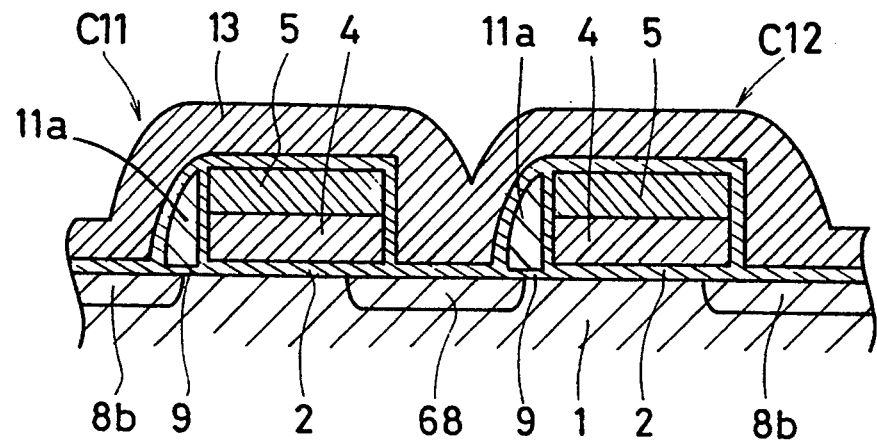
FIG. 7 is a view for explaining a structure according to the first embodiment of the present invention.
Figure 8A:
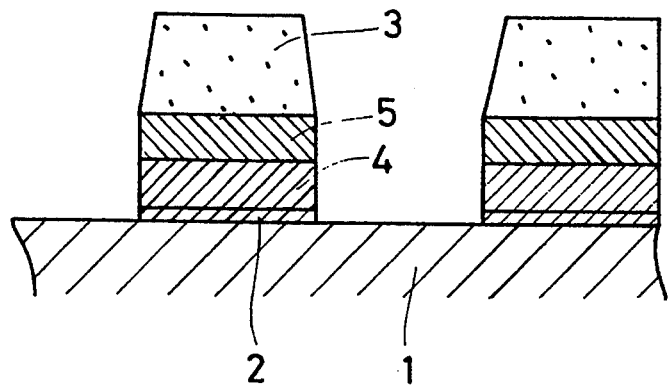
FIGS. 8(a)-8(h) are views for explaining manufacturing steps according to the first embodiment of the present invention.
Figure 8B:
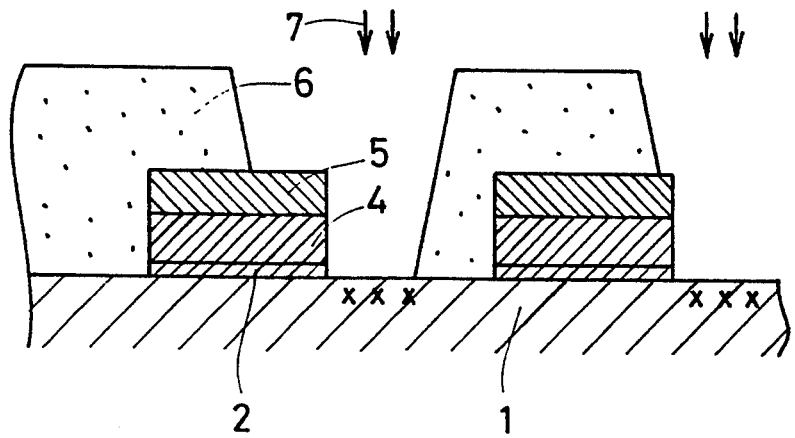
Figure 8C:
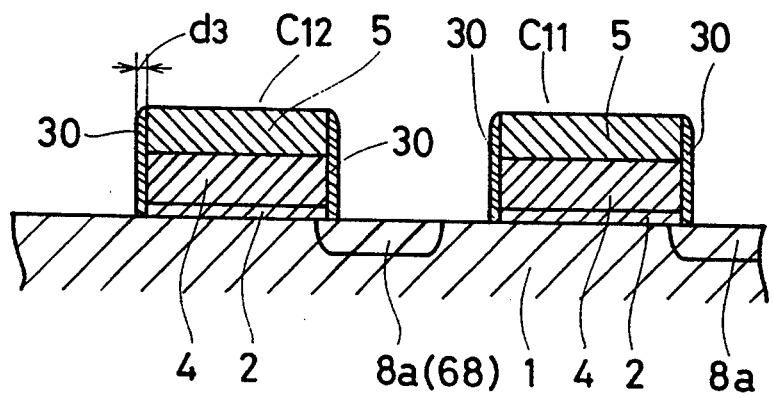
Figure 8D:
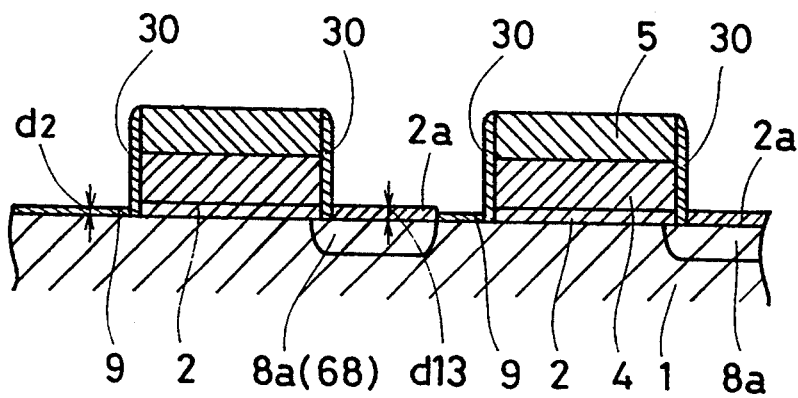
Figure 8E:
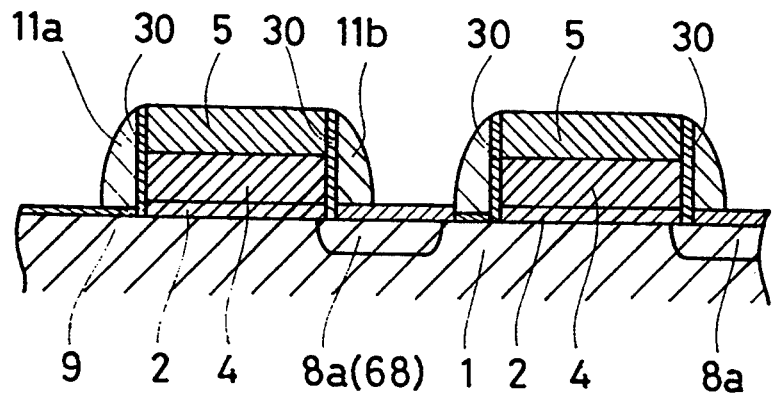
Figure 8F:
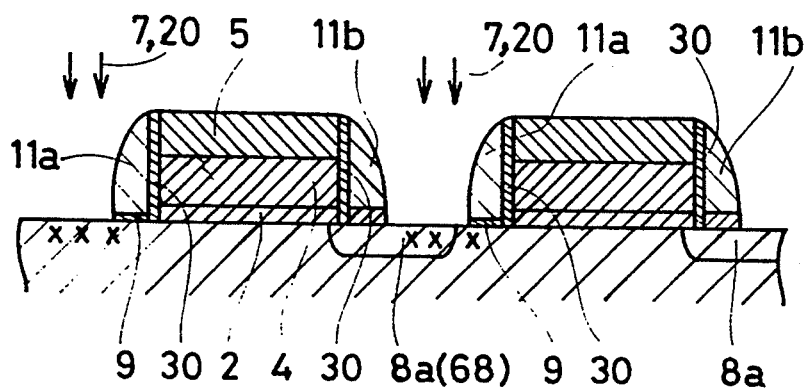
Figure 8G:
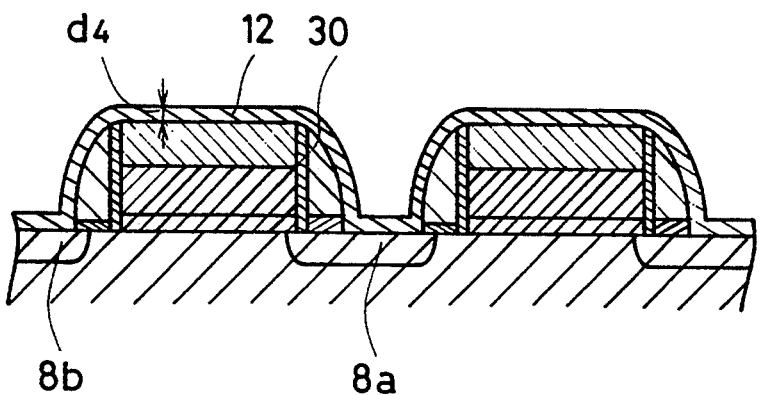
Figure 8H:
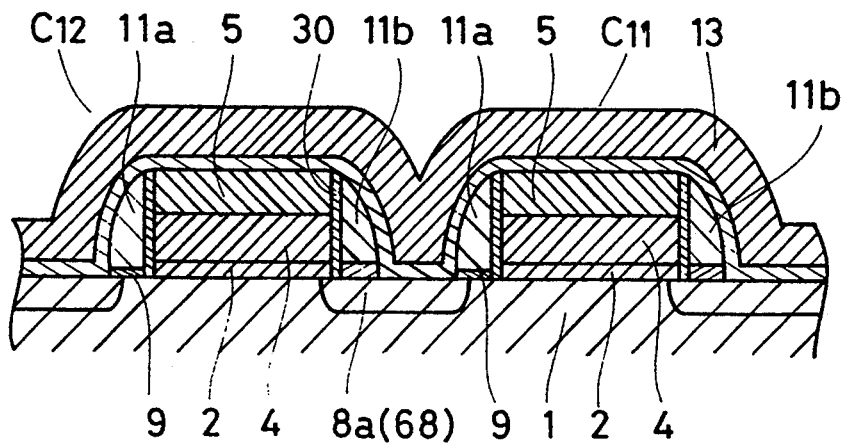

FIG. 7 shows the schematic structure of the memory cells C11 and C12 in FIG. 6. As shown in FIG. 7, a floating gate of a first electrode of the memory cell C12 is provided adjacently to the side having no floating gate of the first electrode of the memory cell C11. An impurity diffusion layer 68 is formed between the memory cells C11 and C12. The impurity diffusion layer 68 functions as a source for the memory cell C11 and as a drain for the memory cell C12.

A manufacturing method will be described below.

As shown in FIG. 8 (a), a first insulating film 2, an AG 4 and a SiO$_2$ film 5 are formed on a p-type Si substrate 1 by using a resist pattern 3 [the same step as in FIG. 3 (a)].

As shown in FIG. 8 (b), the resist pattern 3 is removed and a mask 6 is formed. Then, As ions 7 are implanted in a source region [the same step as in FIG. 3 (b)].

As shown in FIG. 8 (c), the mask 6 is removed to laminate a SiO$_2$ film on the whole surface. Then, etchback is carried out to form side wall insulating films 30 [the same step as in FIG. 3 (c)].

As shown in FIG. 8 (d), thermal oxidation is carried out to form a SiO$_2$ film 9 having a thickness d2 of 80 Å and a SiO$_2$ film 2a having a thickness d13 of 150 Å. As shown in FIG. 8 (e), a polysilicon layer having a thickness of 4000 Å is laminated on the whole surface. Then, etchback is carried out to form polysilicon side wall spacers 11a and 11b on the side walls of the AG 4. The side wall spacer 11a is used for a floating gate. As shown in FIG. 8 (f), As ions 7 and P ions 20 are implanted in a drain region on the Si substrate 1. In this case, there may be removed the unnecessary side wall spacer 11b which is formed in FIG. 8 (e). FIG. 7 shows an embodiment in which the side wall spacer 11b is removed. The side wall spacer 11b may be removed before or after the As and P ions are implanted.

The steps shown in FIGS. 8 (d) to (f) are the same as in FIG. 3 (d).

As shown in FIG. 8 (g), a SiO$_2$ film 12 having a thickness d4 of 200 Å is formed on the whole surface. Then, a polysilicon layer having a thickness of 2000 Å is laminated on the SiO$_2$ film 12 so as to pattern a CG 13 as shown in FIG. 8 (h). The steps shown in FIGS. 8 (g) to (h) are the same as in FIGS. 3 (e).

As shown in FIG. 6, the first embodiment provides a memory cell array in which the source and drain of the adjacent memory cells C11 and C12 and the memory cells C21 and C22 are continuously formed, and the memory cells C11 and C21 and the memory cells C12 and C22 are respectively connected to each other by embedded diffusion layers. AG 1 is connected to the memory cells C11 and C21, while AG 2 is connected to the memory cells C12 and C22. CG1 is connected to the memory cells C11 and C12, while CG2 is connected to the memory cells C21 and C22. As a result, it is not necessary to form a contact region for connecting the impurity diffusion layers as the source and drain and a wiring layer such as a metal or the like. Consequently, the area of the memory cell array can be reduced so that the high integration of an element can be obtained.

According to the first embodiment, the sources and drains of the adjacent memory cells are continuously connected to one another. The sources of the adjacent memory cells can continuously be connected to one another. In addition, the drains of the adjacent memory cells can continuously be connected to one another.

Figure 9:
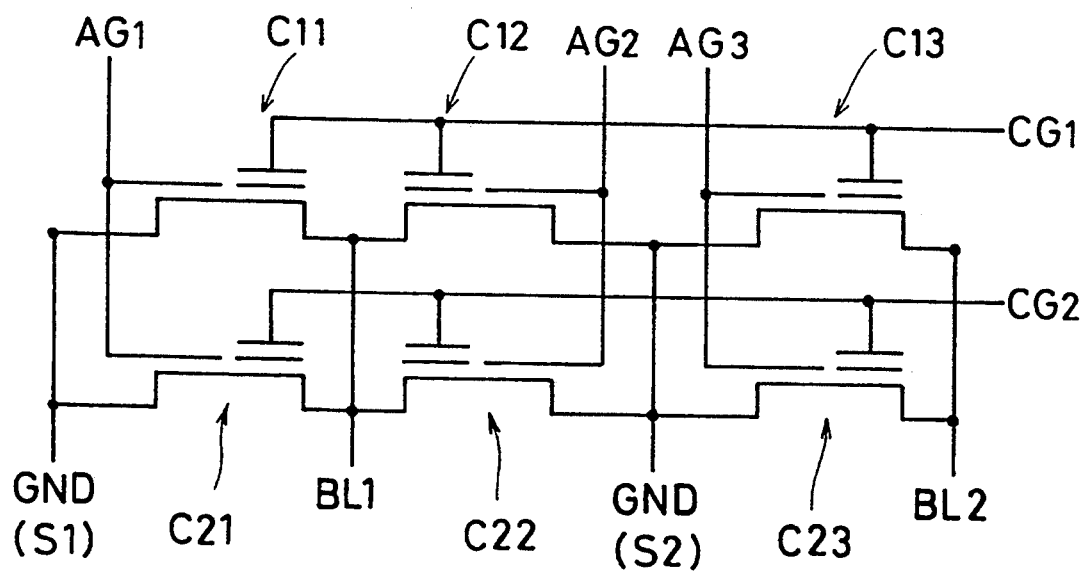
FIG. 9 is an equivalent circuit diagram showing a memory cell array according to a second embodiment of the present invention.

FIG. 9 shows a memory cell array according to a second embodiment of the present invention in which a plurality of memory cells are arranged. The memory cells C11, C12, C13, . . . are provided in one direction such that source regions of the adjacent memory cells C12 and C13 are continuously formed and the drain regions of adjacent memory cells C11 and C12 are continuously formed. The memory cell C13 is provided opposite to the memory cell C11 through the memory cell C12. AGs are continuously connected to one another in the direction orthogonal to the above-mentioned one direction of the memory cells. The source and drain regions are connected in parallel with the direction in which the AGs are connected to one another.

Figure 10:
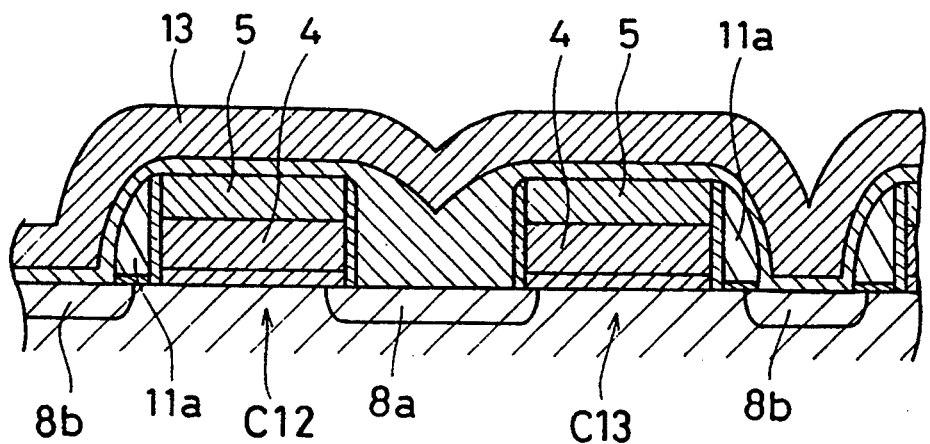
FIG. 10 is a view for explaining a structure according to the second embodiment of the present invention.
Figure 11A:
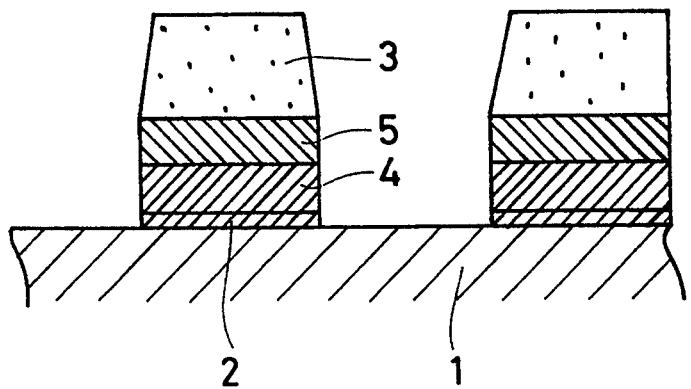
FIGS. 11(a)-(g) are views for explaining manufacturing steps according to the second embodiment of the present invention.
Figure 11B:
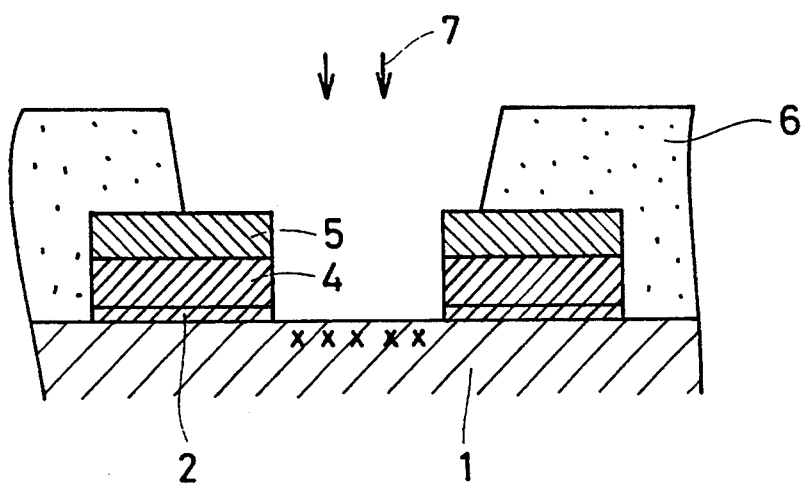
Figure 11C:
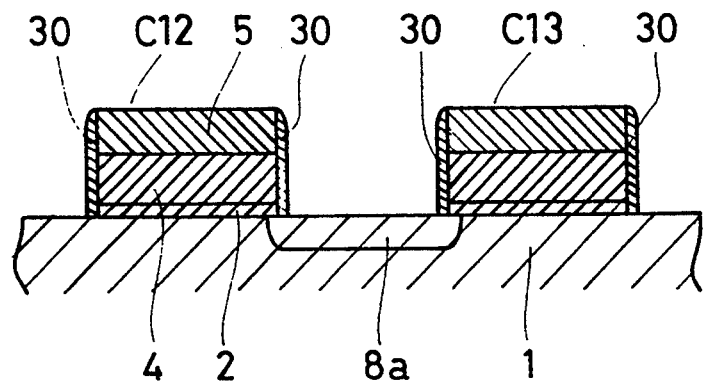
Figure 11D:
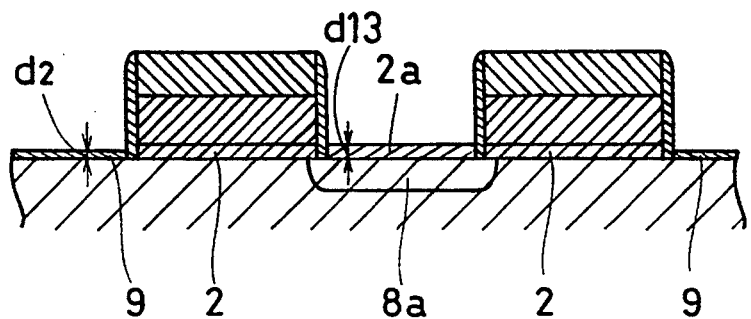
Figure 11E:
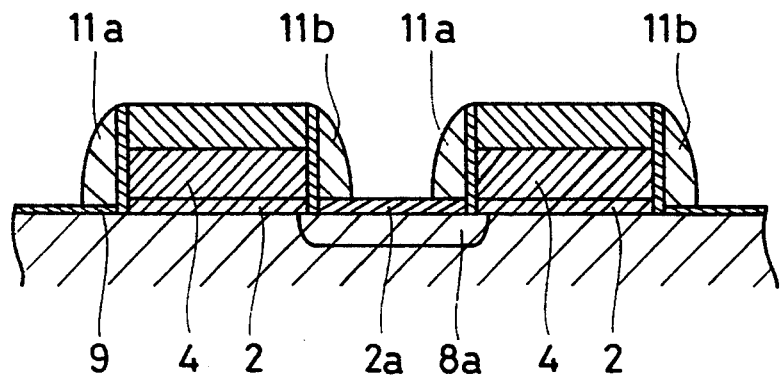
Figure 11F:
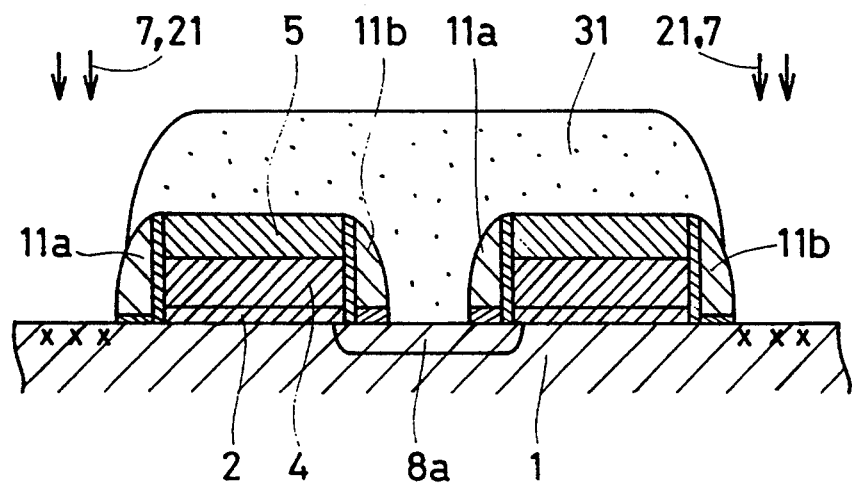
Figure 11G:
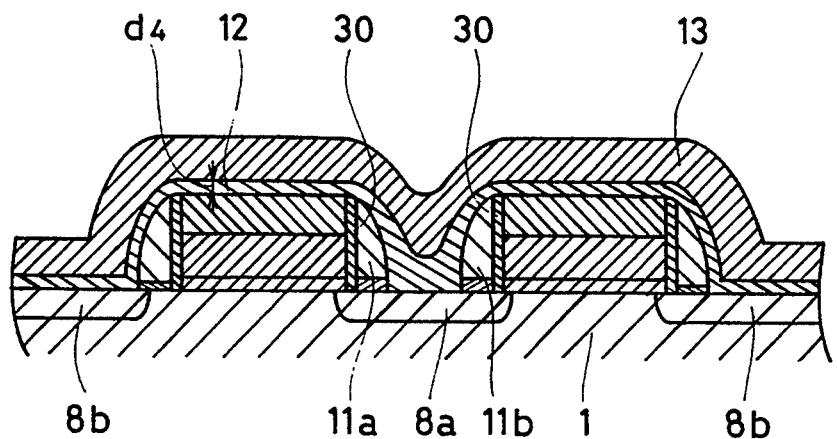

FIG. 10 shows schematic structures of the memory cells C12 and C13 in FIG. 9.

FIG. 10 shows a memory cell array according to a second embodiment of the present invention in which a plurality of memory cells are continuously provided, the memory cell having a floating gate 11a provided as a side wall spacer on one of side wall sides of an AG 4.

FIG. 10 shows a non-volatile memory in which memory cells C12 and C13 are continuously connected to one another in one direction, sources 8a of the adjacent memory cells C12 and C13 are commonly provided, and drains 8b of the adjacent memory cells C11 and C12 are commonly provided.

A manufacturing method will be described below.

As shown in FIG. 11 (a), a first insulating film 2, an AG 4 and a SiO$_2$ film 5 are formed on a p-type Si substrate 1 by using a resist pattern 3 [the same step as in FIG. 3 (a)].

As shown in FIG. 11 (b), the resist pattern 3 is removed and a mask 6 is formed. As ions 7 are implanted in a source region.

As shown in FIG. 11 (c), the mask 6 is removed to laminate a SiO$_2$ film on the whole surface. Then, etchback is carried out to form side wall insulating films 30 [the same step as in FIG. 3 (c)]. In this case, the memory cells C12 and C13 are commonly connected to each other by a source 8a.

As shown in FIG. 11 (d), thermal oxidation is carried out to form a SiO$_2$ film 9 having a thickness d2 of 80 Å and a SiO$_2$ film 2a having a thickness d13 of 150 Å. As shown in FIG. 11 (e), a polysilicon layer having a thickness of 4000 Å is laminated on the whole surface. Then, etchback is carried out to form polysilicon side wall spacers 11a and 11b on the side walls of the AG 4. The side wall spacer 11a is used for a floating gate. In this case, the side wall spacer 11b may be removed.

As shown in FIG. 11 (f), As ions 7 and P ions 21 are implanted in a drain region by using a mask 31 and the floating gate 11a.

As shown in FIG. 11 (g) 0 the mask 31 is removed to form a SiO$_2$ film 12 having a thickness d4 of 200 Å on the whole surface. Then, a polysilicon layer having a thickness of 2000 Å is laminated on the SiO$_2$ film 12. Thereafter, a control gate 13 is patterned.

In order to operate the memory cell array according to the second embodiment, voltages shown in Table 2 are preferably applied to the memory cell C12.

When voltages shown in Table 2 are applied to the memory cell C12 in the above-mentioned memory cell array, writing, erasing and reading can be executed.

TABLE 2

|  | BL2 | BL1 | BL0 | CG1 | CG2 | AG1 | AG2 |
|---|---|---|---|---|---|---|---|
| WRITE | 0 | 5 V | 0 | 12 V | 0 | 0 | 2 V |
| ERASE | 5 V | 5 V | 0 | −11 V | −11 V | 0 | 0 |
| READ | 0 | 2 V | 0 | 5 V | 0 | 0 | 5 V |

It is not necessary to form a contact region in the memory cell array according to the first and second embodiments. Consequently, the area of the memory cell array can be reduced. According to the second embodiment, a cell array area can be reduced as compared with the first embodiment for the following reasons.

(1) According to the second embodiment, it is not necessary to form a side wall spacer on a source region 8a between AG 4 and AG 4. Consequently, a width between AG 4 and AG 4 can be reduced.

(2) In the case where the ions 7 are implanted in order to form the source region 8a [FIGS. 8 (b) and 11 (b)], a region in which FG is to be formed is at least covered by the resist mask 6. According to the first embodiment, the implantation portion of the source region is defined by the mask 6. Consequently, a mask alignment margin is needed. According to the second embodiment, the FG is not provided on the source region 8a between AG 4 and AG 4. Consequently, the ions 7 can be implanted by using the AG 4 as a mask as shown in FIG. 11 (b). Consequently, the mask alignment margin is not needed so that the width between AG 4 and AG 4 can be reduced. When the voltages are applied to the AG 2 and BL1 of the memory cell C12 [see FIGS. 6 and 9 at the time of reading, the voltages are applied to the AG and drain of the memory cell C22. Consequently, an AG transistor of the memory cell C22 is also turned on. If the memory cell C22 is in the state of OVER ERASE, a leak may be caused between BL2 and BL0 in FIG. 6 and between BL1 and S2 in FIG. 9.

Figure 12:
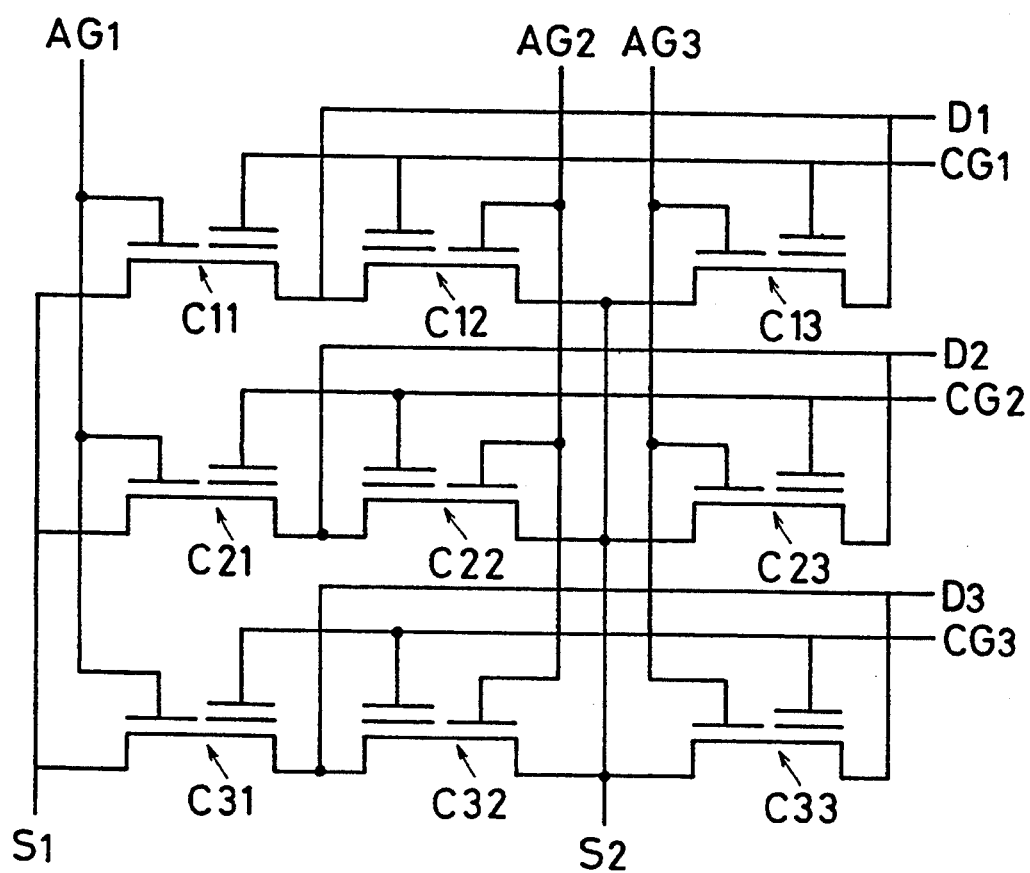
FIG. 12 is an equivalent circuit diagram showing a memory cell array according to a third embodiment of the present invention.
Figure 13A:
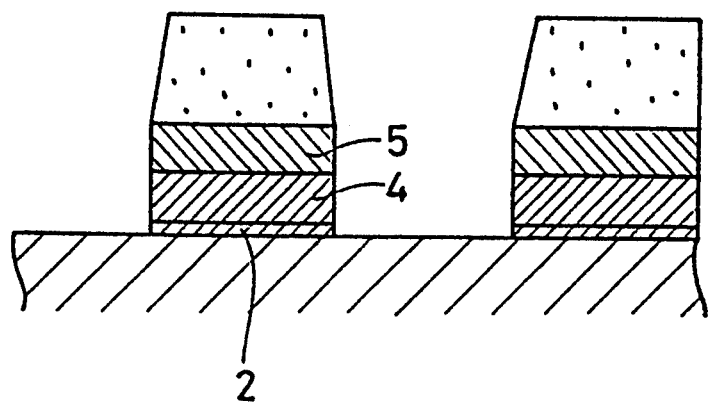
FIG. 13(a)-(i) are views for explaining manufacturing steps according to the third embodiment of the present invention.
Figure 13B:
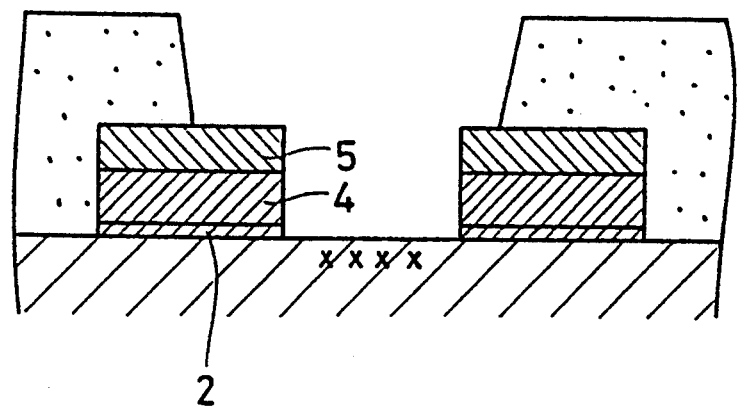
Figure 13C:
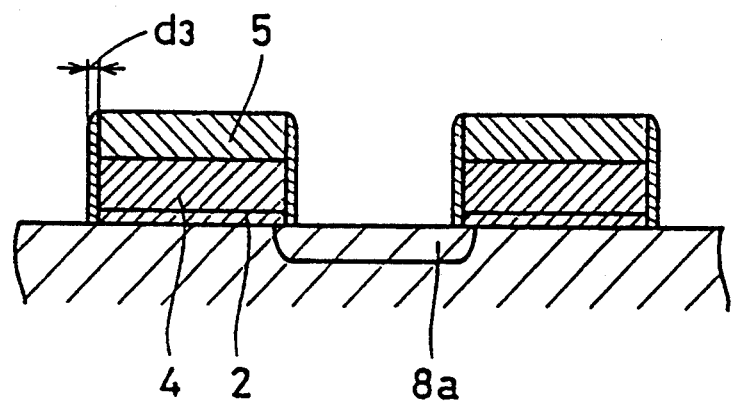
Figure 13D:
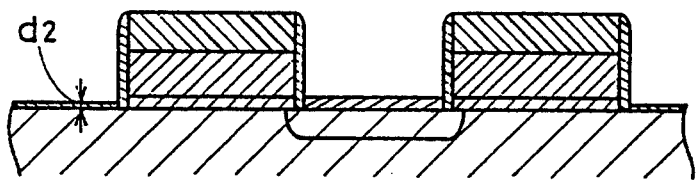
Figure 13E:
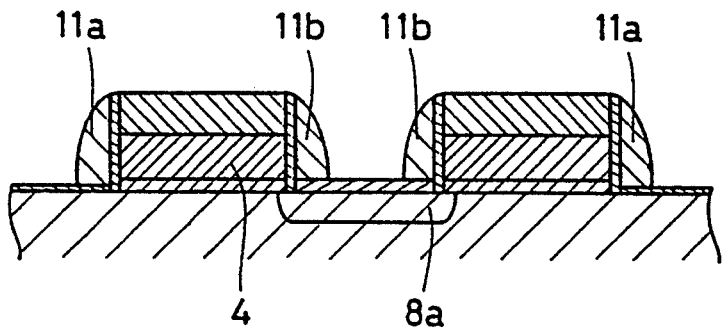
Figure 13F:
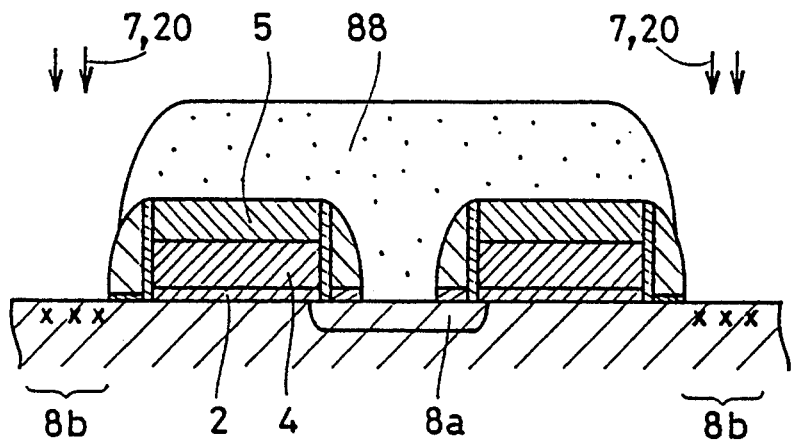
Figure 13G:
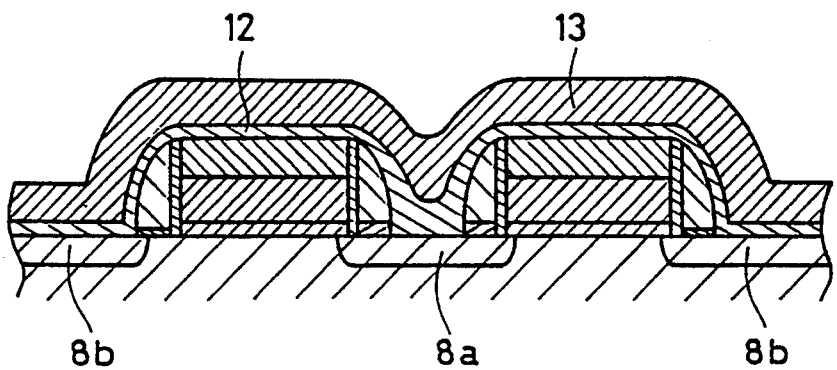
Figure 13H:
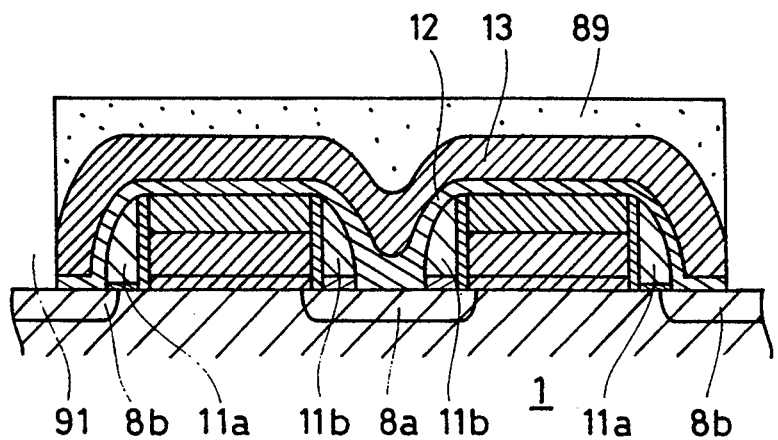
Figure 13I:
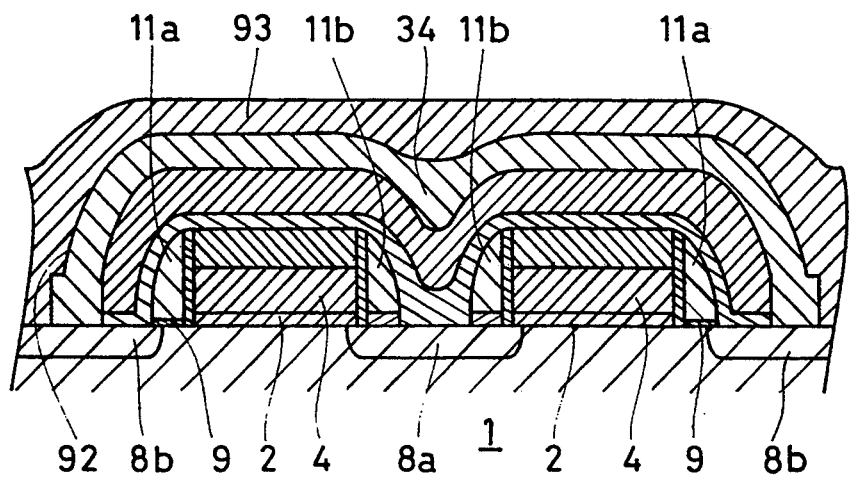
Figure 14:
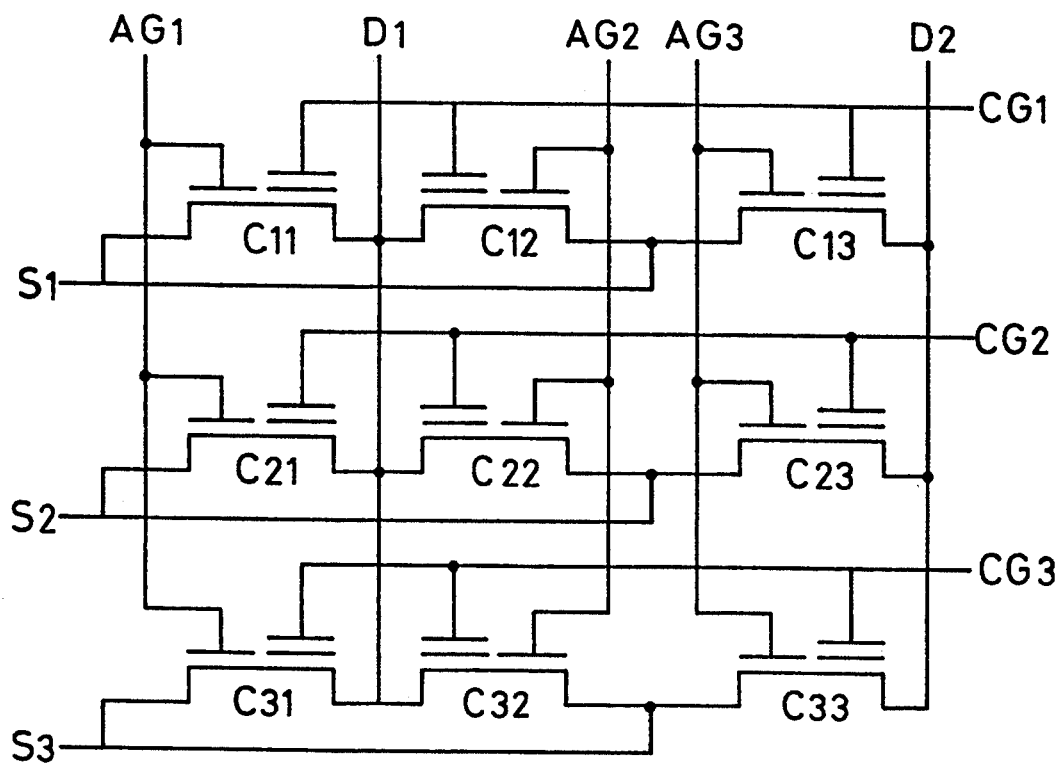
FIG. 14 is an equivalent circuit diagram showing a memory cell array according to fourth and fifth embodiments of the present invention.

To solve the above-mentioned problem, an AG line and a drain or source line are orthogonal to each other so that a voltage is not simultaneously applied to the AG and drain (source) of a memory cell other than the memory cell executing reading as shown in FIGS. 12 and 14. Thus, the leak can be prevented. FIG. 12 shows a memory cell array according to a third embodiment in which a drain line is orthogonal to an AG line. FIG. 14 shows a memory cell array according to a fourth embodiment in which a source line is orthogonal to an AG line.

FIG. 13 (i) shows a memory cell array having a drain side contact according to a third embodiment of the present invention. According to the third embodiment, an AG line 4 is orthogonal to a drain line 93 in parallel with the surface of a Si substrate 1.

FIG. 19 (i) shows a memory cell array having a source side contact according to a fourth embodiment of the present invention. According to the fourth embodiment, an AG line 4 is orthogonal to a source line 31 in parallel with the surface of a Si substrate 1. In addition, a floating gate 11a is provided as one of side wall spacers of the AG line 4. The floating gate 11a is provided only on the drain 8b side. The side wall spacer 11b is not provided on the source 8a side. The side wall spacer 11b may remain on the source 8a side, which is shown in FIG. 18 (i).

FIG. 17 (i) shows a fifth embodiment of the present invention, in which the side wall spacer 11b is used as a contact pad for connecting the source 8a and the source line 31.

A manufacturing method will be described below.

First, a manufacturing method according to the third embodiment will be described below. FIGS. 13 (a) to (i) show the manufacturing method according to the third embodiment.

The steps shown in FIGS. 13 (a) to (g) are the same as in FIGS. 11 (a) to (g). According to the third embodiment, the side wall spacer 11b may be removed as shown in FIG. 10.

In FIG. 13 (g), a CG 13 is patterned. Then, the CG 13 and a SiO$_2$ film on the drain region 8b side are removed by using a mask 89. Consequently, a drain side contact 91 is formed [see FIG. 13 (h)]. As shown in FIG. 13 (i), a NSG film having a thickness of 1500 Å and a BPSG film having a thickness of 5000 Å are sequentially laminated to form a layer insulation film 34. Then, the layer insulation film 34 on a drain region 8b is removed by using a mask (not shown) until a Si substrate 1 is exposed. Consequently, an opening 92 is formed.

According to the present embodiment, the AG line 4 is orthogonal to the drain line 93 in parallel with the surface of the Si substrate 1.

As seen from FIG. 12, the AG line 4 is orthogonal to the drain line 93 in parallel with the surface of the Si substrate 1.

Table 4 shows characteristics at the time of writing, erasing and reading. At the time of reading, the drain 8b (D2) of the memory cell C22 is set to 2 V, the AG 2 of the memory cell C22 is set to 5 V, and CG2 of the memory cell C22 is set to 5 V. Consequently, it is possible to eliminate the problem caused in a VIRTUAL GROUND memory cell, i.e., the disadvantage that a leak is caused between BLs when the memory cell is in the state of OVER ERASE.

TABLE 4

|  | S1 | S2 | D1 | D2 | D3 | CG1 | CG2 | CG3 | AG1 | AG2 | AG3 |
|---|---|---|---|---|---|---|---|---|---|---|---|
| WRITE | 0 | 0 | 0 | 5 V | 0 | 0 | 12 V | 0 | 0 | 2 V | 0 |
| ERASE | 0 | 0 | 0 | 5 V | 5 V | −11 V | −11 V | −11 V | 0 | 0 | 0 |

TABLE 4-continued

|  | S1 | S2 | D1 | D2 | D3 | CG1 | CG2 | CG3 | AG1 | AG2 | AG3 |
|---|---|---|---|---|---|---|---|---|---|---|---|
| READ | 0 | 0 | 0 | 2 V | 0 | 0 | 5 V | 0 | 0 | 5 V | 0 |

A manufacturing method according to the fourth embodiment will be described below.

FIGS. 18 (a) to (i) show the manufacturing method according to the fourth embodiment.

The steps shown in FIGS. 18 (a) to (g) are the same as in FIGS. 11 (a) to (g) [FIGS. 13 (a) to (g)].

As shown in FIG. 18 (g), a CG 13 is patterned. Then, the CG 13, a SiO$_2$ film 12 and a side wall 11b on the source region 8a side are removed to form a source side contact [see FIG. 18 (h)]. Thereafter, a NSG film having a thickness of 1500 Å and a BPSG film having a thickness of 5000 Å are sequentially laminated to form a layer insulation film 34 as shown in FIG. 18 (i). The layer insulation film 34 in a source region 8a is removed by using a mask (not shown) until a Si substrate 1 is exposed. Consequently, an opening is formed. Then, a source line 31 is formed. Thus, there can be formed a cell array having a cell in which a polysilicon side wall 11a is provided on the side wall of a first electrode 4.

As seen from FIG. 14, the AG line (AG 1, AG 2 and AG 3) is orthogonal to the source line (S1, S2 and S3) in parallel with the surface of the Si substrate.

Table 3 shows characteristics at the time of writing, erasing and reading. At the time of reading in the memory cell C22, the drain 8b (D1) of the memory cell C22 is set to 2 V, the AG 2 of the memory cell C22 is set to 5 V, and the CG 2 of the memory cell C22 is set to 5 V, and the sources 8a (S1) of the memory cells C11, C12 and C13 are set to 2 V, and the sources 8a (S3) of the memory cells C31, C32 and C33 are set to 2 V.

TABLE 3

|  | S1 | S2 | S3 | D1 | D2 | CG1 | CG2 | CG3 | AG1 | AG2 | AG3 |
|---|---|---|---|---|---|---|---|---|---|---|---|
| WRITE | 0 | 0 | 0 | 5 V | 0 | 0 | 12 V | 0 | 0 | 2 V | 0 |
| ERASE | 0 | 0 | 0 | 5 V | 5 V | −11 V | −11 V | −11 V | 0 | 0 | 0 |
| READ | 2 V | 0 | 2 V | 2 V | 0 | 0 | 5 V | 0 | 0 | 5 V | 0 |

Finally, a manufacturing method according to the fifth embodiment will be described below.

FIGS. 17 (a) to (i) show the manufacturing method according to the fifth embodiment.

The steps shown in FIGS. 17 (a) to (d) are the same as in FIGS. 11 (a) to (d) [FIGS. 18 (a) to (d)].

As shown in FIG. 17 (e), a polysilicon layer 91 having a thickness of 4000 Å is laminated.

Subsequently, etchback is carried out to make side wall spacers 11a and 11b. In this case, if R is not greater than 8000 Å, the side wall spacers 11b on the source region 8a between AG 4 and AG 4 come in contact with each other and the region between AG 4 and AG 4 on the source region 8a is filled with polysilicon. As a result, the pad-like side wall spacer 11b for connecting a source line 31 is formed. The side wall spacers 11b may be provided apart from one another. If R is not smaller than 8000 Å, the side wall spacers 11b are provided apart from one another [see FIG. 17 (f)].

Then, As ions 7 and P ions 20 are implanted in the drain region 8b side by using a mask 83 [see FIG. 17 (g)].

The mask 83 is removed to form a SiO$_2$ film 12 having a thickness of 200 Å. Then, a polysilicon layer 13 having a thickness of 2000 Å is laminated [see FIG. 17 (h)]. Thereafter, the polysilicon layer 13 and SiO$_2$ film 12 in a source 8a region are removed by using a mask (not shown).

As shown in FIG. 17 (i), a NSG film having a thickness of 1500 Å and a BPSG film having a thickness of 5000 Å are sequentially laminated to form a layer insulation film 34. The layer insulation film 34 in the source 8a region is removed by using a mask (not shown). Consequently, an opening 81 is formed. Then, a source line 31 is formed [FIG. 17 (i)]. When the opening 81 is formed, the depth of an opening portion can be made small by the side wall spacer 11b.

In the present embodiment, the AG line 4 is orthogonal to the source line 31 in parallel with the surface of a Si substrate 1.

Figure 16:
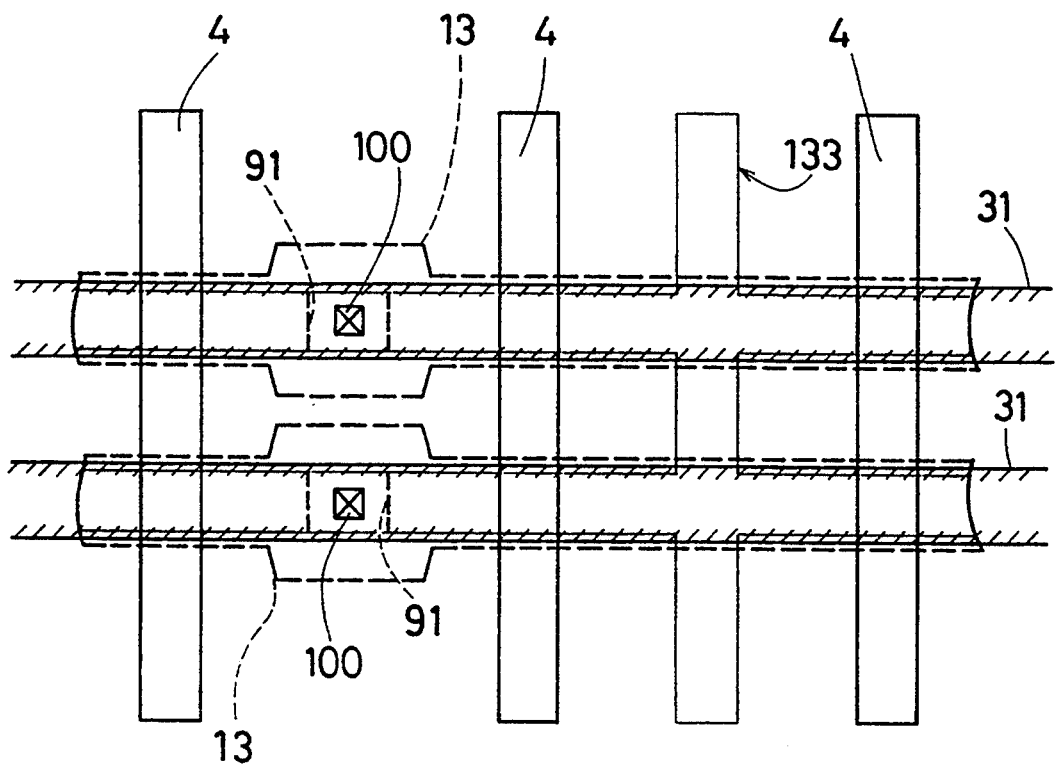
FIG. 16 is a view showing the memory cell array according to the third, fourth and fifth embodiments of the present invention.
Figure 17A:
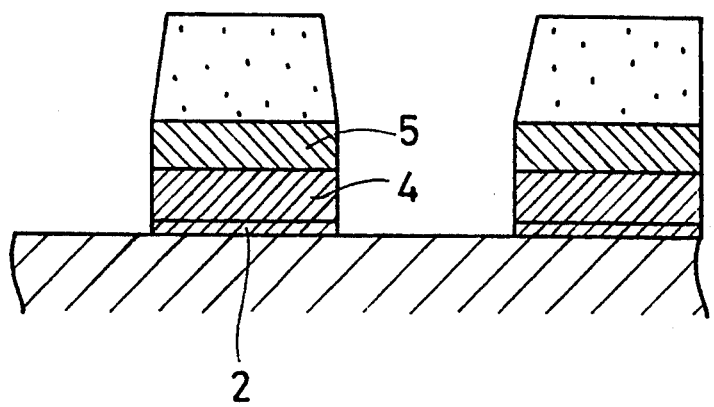
FIG. 17(a)-(i) are views for explaining manufacturing steps according to the fifth embodiment of the present invention.
Figure 17B:
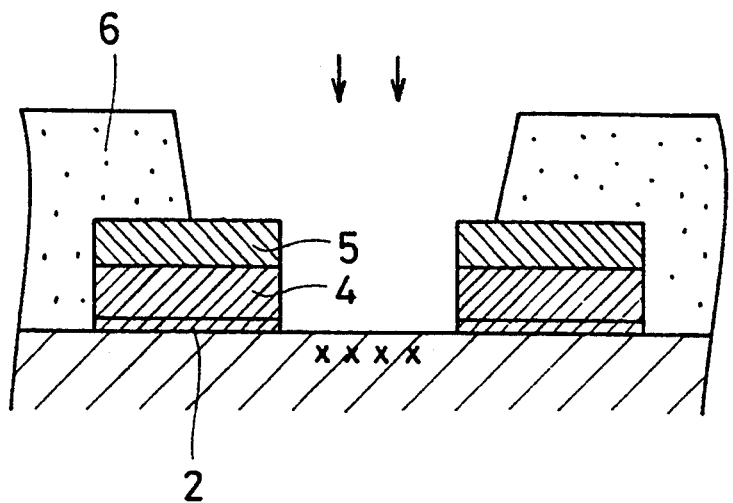
Figure 17C:
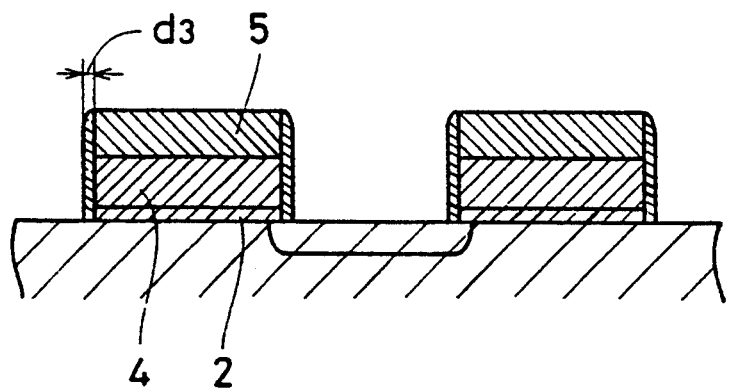
Figure 17D:
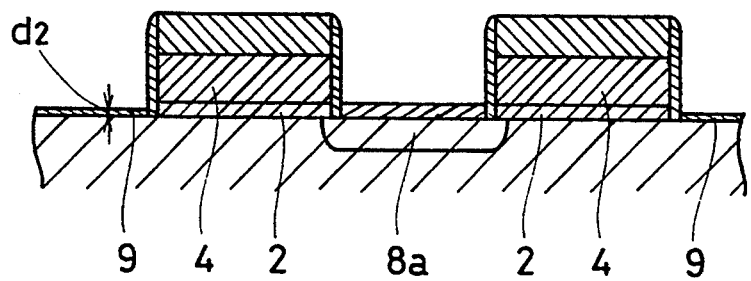
Figure 17E:
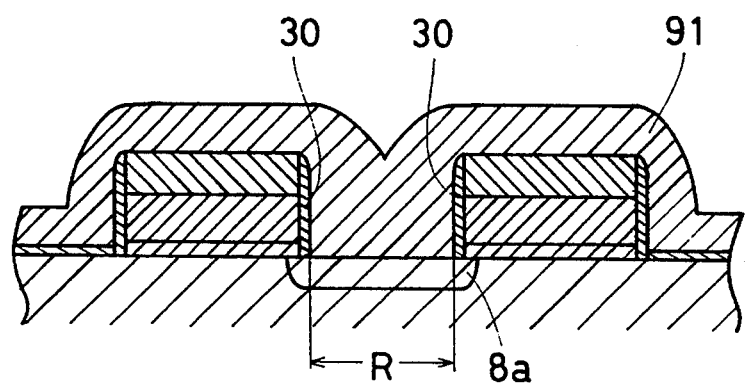
Figure 17F:
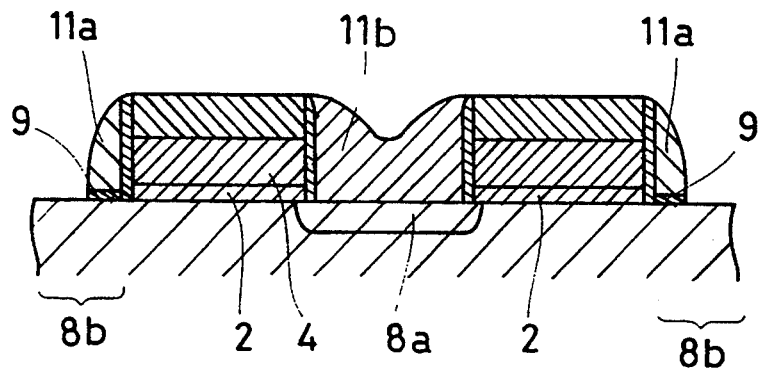
Figure 17G:
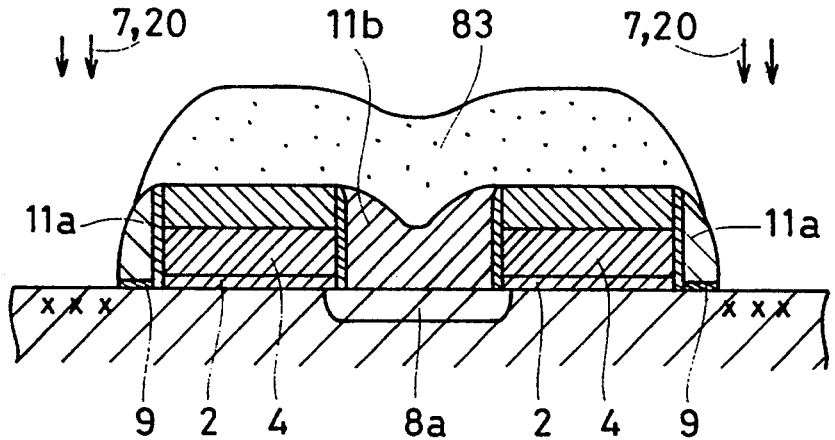
Figure 17H:
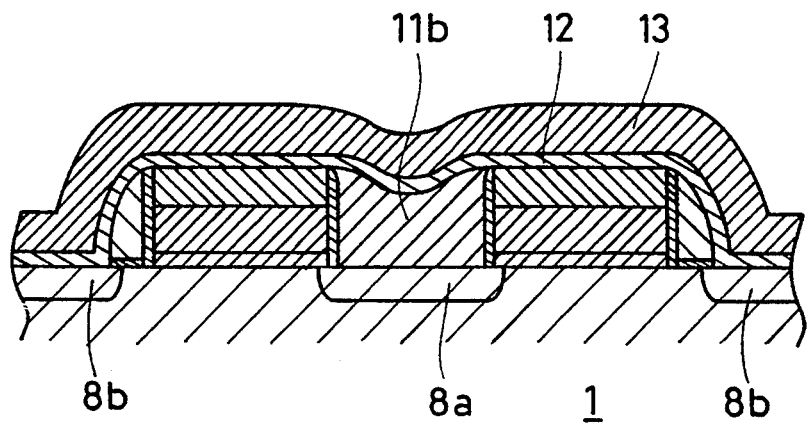
Figure 17I:
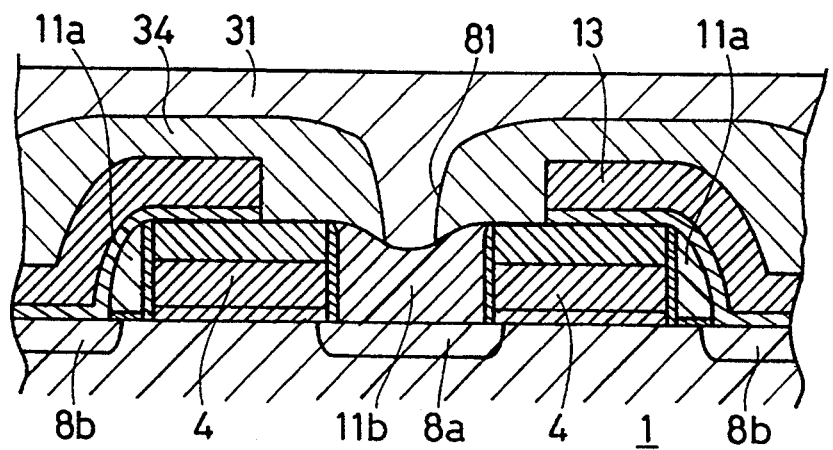
Figure 18A:
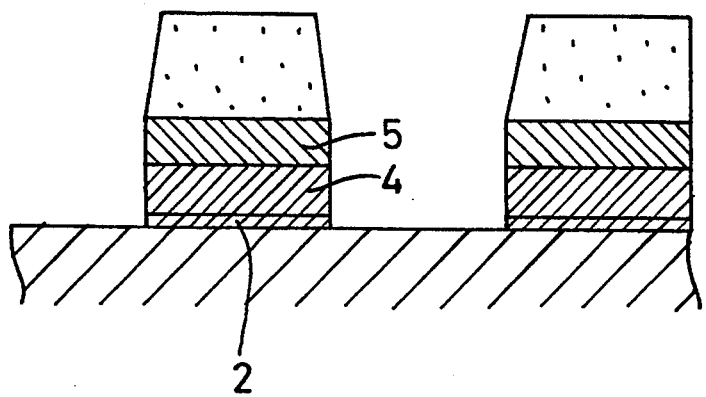
FIG. 18(a)-(i) are views for explaining manufacturing steps according to the fourth embodiment of the present invention.
Figure 18B:
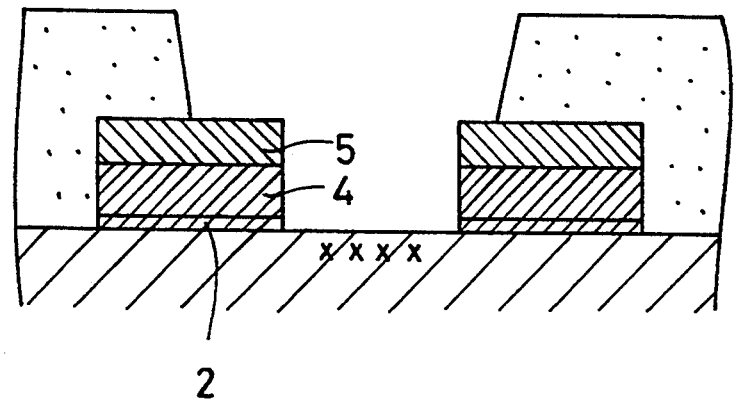
Figure 18C:
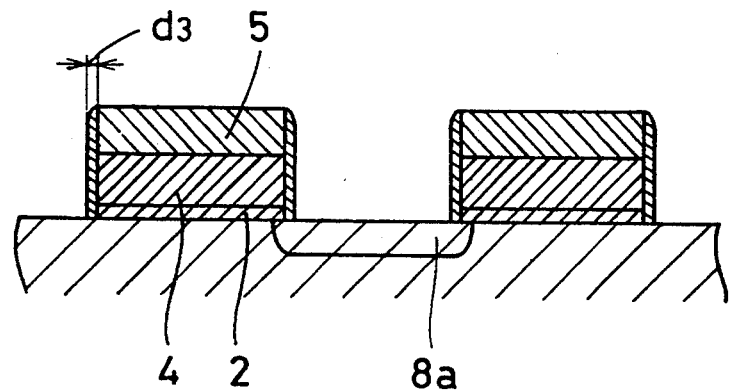
Figure 18D:
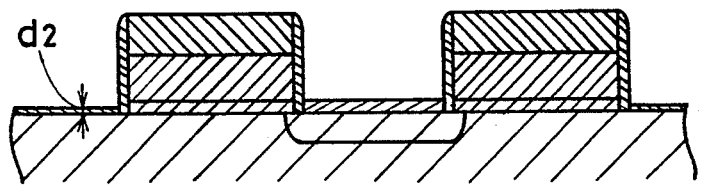
Figure 18E:
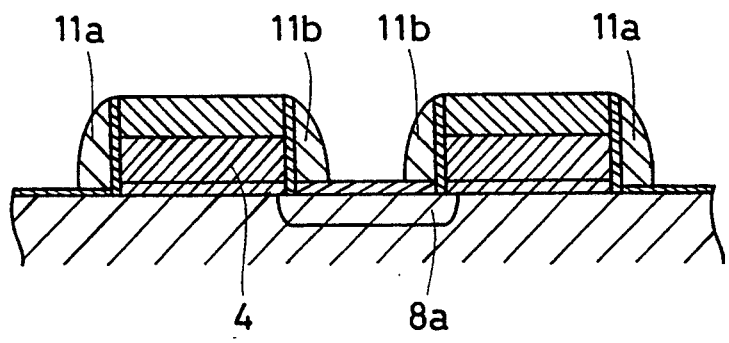
Figure 18F:
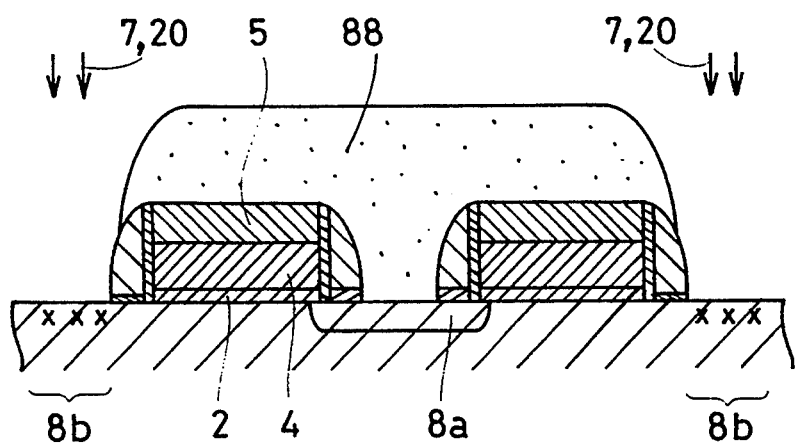
Figure 18G:
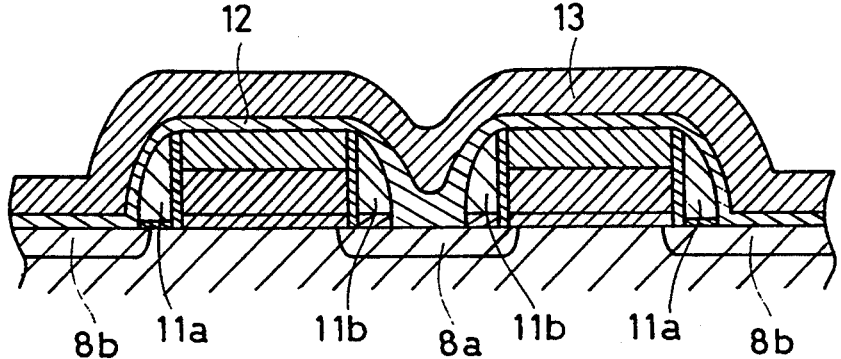
Figure 18H:
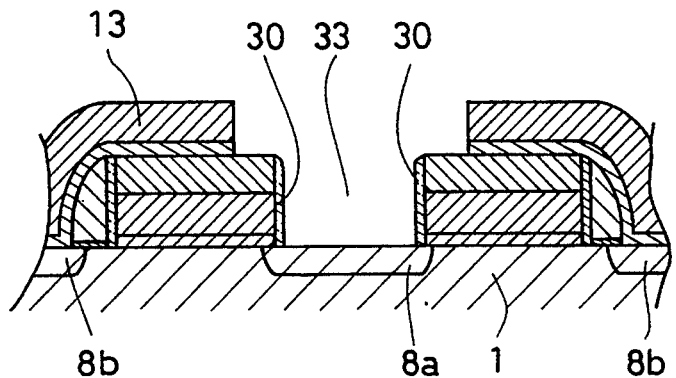
Figure 18I:
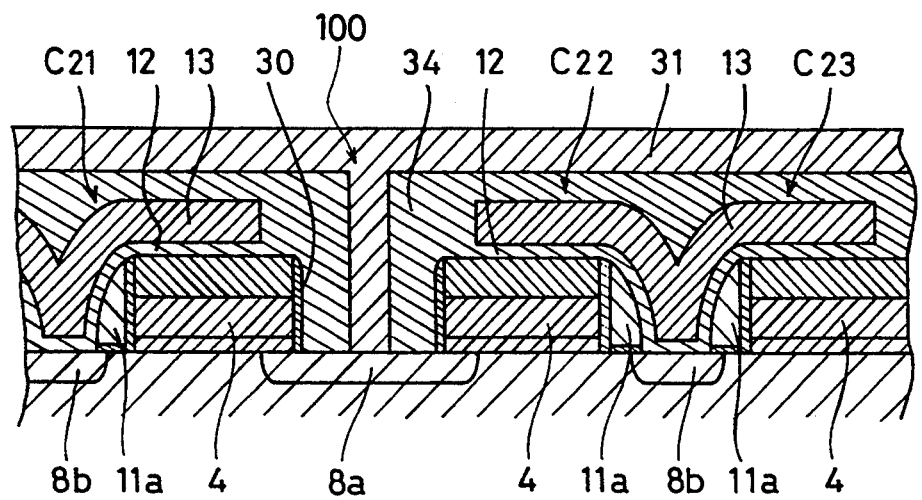

FIG. 16 is plan views showing the third, fourth and fifth embodiments. As seen from FIG. 16, the AG line 4 is orthogonal to the source line 31 on a plane basis. According to the third embodiment, an opening 92 is formed on the drain region [see FIG. 13 (i)]. According to the fourth and fifth embodiments, openings 33 and 81 are formed on the CG of the source region [see FIGS. 17 (i) and 18 (h)]. The source line 31 is formed which is connected to the source region through a source side contact 100 [see FIGS. 18 (i) and 19 (i)].

Figure 15:
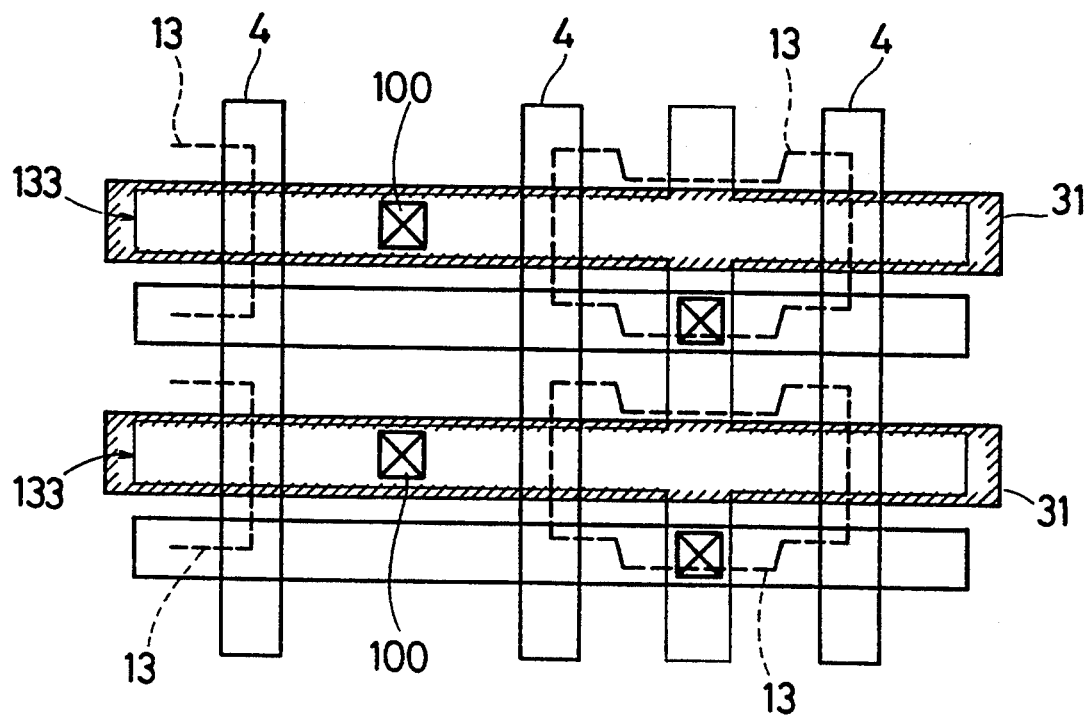
FIG. 15 is a view showing the memory cell array according to the fourth and fifth embodiments of the present invention.

FIG. 15 shows the fourth and fifth embodiments. In FIG. 15, the CG 13 is patterned to cover at least the floating gate 11a and the drain region. The source line 31 is connected to the source region through the contact 100 on the source region. In FIGS. 15 and 16, the reference numeral 133 denotes an active region.

According to the present invention, a side wall polysilicon electrode on the side wall of an auxiliary gate is used as a floating gate for a source-side injection type FLASH EEPROM. Consequently, it is possible to obtain a non-volatile memory in which a writing efficiency is enhanced so that writing can be performed at a single supply voltage of 5 V or less and at a speed of 1 μs or less, a single power source is quite enough. The area of the memory cell can be reduced. In addition, an on-chip high voltage generation circuit can easily be designed due to a low programming current around 10 μA.

What is claimed is:

1. A non-volatile memory having a memory cell, the memory cell comprising:
   a semiconductor substrate having first and second impurity diffusion layers,
   a first insulating film and a tunnel dielectric film provided on the semiconductor substrate between the first and the second impurity diffusion layers, the first insulating film formed on the side of the first impurity diffusion layer, the tunnel dielectric film formed on the side of the second impurity diffusion layer,
   an auxiliary gate electrode formed on the first insulating film, a floating gate formed on the tunnel dielectric film and adjacent a side wall of the auxiliary gate electrode through an insulating film, and a control gate electrode covering the floating gate and at least partially covering the auxiliary gate electrode through a second insulating film, wherein channel hot electrons are injected from the inversion layer formed under the first electrode, which is controlled by the first electrode, to the floating gate.

2. A non-volatile memory according to claim 1, wherein the floating gate overlaps with the second impurity diffusion layer through the tunnel dielectric film.

3. A non-volatile memory according to claim 1, wherein the control gate electrode is provided through the second insulating films on the second impurity diffusion layer, floating gate, auxiliary gate electrode and first impurity diffusion layer.

4. A non-volatile memory according to claim 1, wherein the floating gate is provided as a side wall spacer on the side wall of the auxiliary gate electrode on a self-aligning basis.

5. A non-volatile memory having a memory cell, the memory cell comprising:

a semiconductor substrate having first and second impurity diffusion layers, a first insulating film provided on the semiconductor substrate between the first and second impurity diffusion layers and on the first impurity diffusion layer side, a tunnel dielectric film extended to a second impurity diffusion layer region which is provided opposite to the first impurity diffusion layer side, an auxiliary gate electrode formed on the first insulating film, a floating gate formed on the tunnel dielectric film and on the side wall of the auxiliary gate electrode through an insulating film, and a control gate electrode provided at least on the floating gate and at least partially covering the auxiliary gate electrode through a second insulating film so as to control the potential of the floating gate, wherein a plurality of memory cells are continuously provided in one direction and the first and second impurity diffusion layers of the adjacent memory cells are continuously formed.

6. A non-volatile memory according to claim 5, wherein a plurality of memory cells, which are continuously formed in one direction, are provided in parallel with the surface of the semiconductor substrate and in the other direction orthogonal to the one direction, and the impurity diffusion layers of the memory cells, which are adjacently provided in the other direction, are connected to one another by embedded diffusion layers.

7. A non-volatile memory according to claim 5, wherein the floating gate overlaps with the second impurity diffusion layer through the tunnel dielectric film.

8. A non-volatile memory according to claim 5, wherein the floating gate is provided as a side wall spacer on the side wall of the auxiliary gate electrode on a self-aligning basis.

9. A non-volatile memory according to claim 5, wherein the control gate electrodes are extended through the second insulating films to the second impurity diffusion layers, floating gates, auxiliary gate electrodes and first impurity diffusion layers of the adjacent memory cells.

10. A non-volatile memory according to claim 5, wherein the auxiliary gate electrode and floating gate of the adjacent memory cells are continuously provided adjacently to each other.

11. A non-volatile memory having a memory cell, the memory cell comprising:

a semiconductor substrate having first and second impurity diffusion layers, a first insulating film provided on the semiconductor substrate between the first and second impurity diffusion layers and on the first impurity diffusion layer side, a tunnel dielectric film extended to a second impurity diffusion layer region which is provided opposite to the first impurity diffusion layer side, an auxiliary gate electrode formed on the first insulating film, a floating gate formed on the tunnel dielectric film and on the side wall of the auxiliary gate electrode through an insulating film, and a control gate electrode provided at least on the floating gate and at least partially covering the auxiliary gate through a second insulating film so as to control the potential of the floating gate, wherein a plurality of memory cells are continuously provided in one direction, three adjacent memory cells are treated as a unit, the first impurity diffusion layers of one pair of adjacent memory cells are commonly provided, and the second impurity diffusion layers of the other pair of adjacent memory cells are commonly provided.

12. A non-volatile memory according to claim 11, wherein the floating gate is provided as a side wall spacer on the side wall of the auxiliary gate electrode on a self-aligning basis.

13. A non-volatile memory according to claim 11, wherein the first electrode has a floating gate provided as one of side wall spacers on the second impurity diffusion layer side and also has the other side wall spacer provided on the first impurity diffusion layer side, the other side wall spacer being formed simultaneously with the floating gate, and the other side wall spacer and the first impurity diffusion layer are connected to each other.

14. A non-volatile memory according to claim 11, wherein a plurality of memory cells, which are continuously formed in one direction, are provided in parallel with the surface of the semiconductor substrate and in the other direction orthogonal to the one direction, and the impurity diffusion layers of the memory cells, which are adjacently provided in the other direction, are connected to one another by embedded diffusion layers.

15. A non-volatile memory according to claim 11, wherein the floating gate overlaps with the second impurity diffusion layer through the tunnel dielectric film.

16. A non-volatile memory according to claim 11, wherein the first impurity diffusion layers of the adjacent memory cells are commonly provided, a first wiring is pulled out of the first impurity diffusion layer, and the auxiliary gate electrodes of the memory cells are provided adjacently to each other through the pull-out first wiring.

17. A non-volatile memory according to claim 11, wherein the second impurity diffusion layers of the adjacent memory cells are commonly provided, and the floating gates of the memory cells are continuously provided adjacently to each other.

18. A non-volatile memory according to claim 11, wherein the floating gate is provided as a side wall on the side wall side of the auxiliary gate electrode, the second impurity diffusion layers of the adjacent memory cells are commonly provided, a second wiring is pulled out of the second impurity diffusion layer, and the floating gates of the memory cells are provided adjacently to each other through the pull-out second wiring.

19. A non-volatile memory according to claim 11, wherein the floating gate is provided as a side wall on the side wall side of the auxiliary gate electrode, the first impurity diffusion layers of the adjacent memory cells are commonly provided, and the auxiliary gate electrodes of the memory cells are continuously provided adjacently to each other.

20. A non-volatile memory having a memory cell, the memory cell comprising:
a semiconductor substrate having first and second impurity diffusion layers,
a first insulating film provided on the semiconductor substrate between the first and second impurity diffusion layers and on the first impurity diffusion layer side,
a tunnel dielectric film extended to a second impurity diffusion layer region which is provided opposite to the first impurity diffusion layer side,
an auxiliary gate electrode formed on the first insulating film,
a floating gate formed on the tunnel dielectric film and on the side wall of the auxiliary gate electrode through an insulating film, and
a control gate electrode provided at least on the floating gate and at least partially covering the auxiliary gate electrode through a second insulating film so as to control the potential of the floating gate,
wherein a plurality of memory cells are arranged in a matrix,
the memory cells are arranged in a matrix in the direction of Y and have first electrodes connected to one another in the direction of Y, the memory cells are arranged in a matrix in the direction of X and have the adjacent first impurity diffusion layers commonly formed and the adjacent second impurity diffusion layers continuously formed, one of the first and second impurity diffusion layers is connected in the direction of X, and the other impurity diffusion layer is connected in the direction of Y.

21. A non-volatile memory according to claim 20, wherein the floating gate overlaps with the second impurity diffusion layer through the tunnel dielectric film.

22. A non-volatile memory according to claim 20, wherein the floating gate is provided as a side wall spacer on the side wall of the auxiliary gate electrode on a self-aligning basis.

23. A non-volatile memory according to claim 20, wherein the auxiliary gate electrode has a floating gate provided as one of side wall spacers on the second impurity diffusion layer side and also has the other side wall spacer provided on the first impurity diffusion layer side, the other side wall spacer being formed simultaneously with the floating gate, and the other side wall spacer and the first impurity diffusion layer are connected to each other.

24. A non-volatile memory according to claim 20, wherein the first wirings are pulled out of the second impurity diffusion layers of the memory cells, which are continuously provided in the direction of X, are connected to one another in the direction of X, and the first impurity diffusion layers of the memory cells, which are continuously provided in the direction of Y, are connected to one another through embedded diffusion layers in the direction of Y.

25. A non-volatile memory according to claim 20, wherein the first wirings pulled out of the second impurity diffusion layers of the memory cells, which are continuously provided in the direction of X, are connected to one another in the direction of X, the first impurity diffusion layers of the memory cells, which are continuously provided in the direction of Y, are connected to one another through the embedded diffusion layers in the direction of Y, the floating gate is provided as a side wall spacer on the side wall of the auxiliary gate electrode, and the side wall spacer comes into contact with the first impurity diffusion layer.

26. A non-volatile memory having a memory cell, the memory cell comprising:
a semiconductor substrate having first and second impurity diffusion layers,
a first insulating film on the substrate between the first and second impurity diffusion layers and over at least a portion of said first impurity diffusion layer,
a tunnel dielectric film covering at least a portion of said second impurity diffusion layer,
an auxiliary gate electrode on the first insulating film,
a floating gate on the tunnel dielectric film, one side of said floating gate being self-aligned with a side insulating film adjacent a side wall of the auxiliary gate electrode, said floating gate covered by a second insulating film, and
a control gate electrode on said second insulating film and controlling the potential of the floating gate, said control gate electrode overlying said auxiliary gate electrode and at least partially overlying the floating gate,
wherein channel hot electrons are injected from an inversion layer formed under the first electrode and controlling the floating gate.

27. A non-volatile memory according to claim 26, wherein the floating gate overlaps the second impurity diffusion layer through the tunnel dielectric film.

28. A non-volatile memory according to claim 26, wherein the second electrode and second insulating film cover the second impurity diffusion layer, floating gate, auxiliary gate electrode and first impurity diffusion layer.

29. A non-volatile memory according to claim 26, wherein the floating gate is a self-aligned side wall spacer on said side wall of the auxiliary gate electrode.

30. A non-volatile memory having a plurality of memory cells, each memory cell comprising:
a semiconductor substrate having first and second impurity diffusion layers,
a first insulating film on the substrate between the first and second impurity diffusion layers and over at least a portion of said first impurity diffusion layer,
a tunnel dielectric film adjacent said first insulating film and covering at least a portion of said second impurity diffusion layer,
an auxiliary gate electrode on the first insulating film, a floating gate on the tunnel dielectric film and separated from a side wall of the auxiliary gate electrode by a side insulating film, one side of said floating gate being self-aligned with said side insulating film, a second insulating film covering at least said floating gate and at least a portion of said auxiliary gate electrode, and a control gate electrode on said second insulating film overlying said floating gate and at least partially overlying the auxiliary gate, and controlling the potential of the floating gate, wherein a plurality of memory cells are continuously provided in one direction, and the first and second impurity diffusion layers of adjacent memory cells are contiguous.

31. A non-volatile memory according to claim 30, wherein said plurality of memory cells are continuously formed in a first direction and are parallel to the surface of the semiconductor substrate in a second direction orthogonal to the first direction, and the first impurity diffusion layer of each memory cell, are adjacently provided in the second direction and are connected to one another by embedded diffusion layers.

32. A non-volatile memory according to claim 30, wherein the floating gate overlaps the second impurity diffusion layer through the tunnel dielectric film.

33. A non-volatile memory according to claim 30, wherein the floating gate is a self-aligned side wall spacer near said side wall of the auxiliary gate electrode.

34. A non-volatile memory according to claim 30, wherein said control gate electrode and second insulating film cover the second impurity diffusion layer, floating gate, auxiliary gate electrode and first impurity diffusion layer of an adjacent memory cell.

35. A non-volatile memory according to claim 30, wherein the auxiliary gale electrode and floating gate of the adjacent memory cells are continuously provided adjacently to each other.

36. A non-volatile memory having a plurality of memory cells, each memory cell comprising:

a semiconductor substrate having first and second impurity diffusion layers, a first insulating film on the substrate between the first and second impurity diffusion layers and over at least a portion of said first impurity diffusion layer, a tunnel dielectric film covering said second impurity diffusion layer, an auxiliary gate electrode on the first insulating film, a floating gate on the tunnel dielectric film and separated from a side wall of the auxiliary gate electrode by a side insulating film, one side of said floating gate being self-aligned with said side insulating film, a second insulating film covering at least said floating gate and at least a portion of said auxiliary gate electrode, and a control gate electrode on said second insulating film to overlie said floating gate and at least a portion of said auxiliary gate electrode and controlling the potential of the floating gate, wherein at least three adjacent memory cells are continuously aligned in a first direction, the first impurity diffusion layers of one pair of said three adjacent memory cells are contiguous, and the second impurity diffusion layers of a second pair of said three adjacent memory cells are contiguous.

37. A non-volatile memory according to claim 36, wherein the floating gate is a self-aligned side wall spacer on said side wall of the auxiliary gate electrode.

38. A non-volatile memory according to claim 36, wherein said auxiliary gate electrode has said floating gate as a side wall spacer and has a second side wall spacer over at least a portion of the first impurity diffusion layer, the second side wall spacer being formed simultaneously with the floating gate, and the second side wall spacer and the first impurity diffusion layer being connected.

39. A non-volatile memory according to claim 36, wherein a plurality of memory cells are continuously formed in a first direction and are parallel to the surface of the semiconductor substrate in a second direction orthogonal to the first direction, and the first impurity diffusion layer of the memory cells, which are adjacently provided in the second direction, are connected to one another by embedded diffusion layers.

40. A non-volatile memory according to claim 36, wherein the floating gate overlaps the second impurity diffusion layer through the tunnel dielectric film.

41. A non-volatile memory according to claim 36, wherein the first impurity diffusion layer of the adjacent memory cells are contiguous, a first wiring is electrically connected to the first impurity diffusion layer, and the auxiliary gate electrodes of the memory cells are adjacent each other through said first wiring.

42. A non-volatile memory according to claim 36, wherein the second impurity diffusion layers of adjacent memory cells are contiguous, and the floating gates of the memory cells are adjacent.

43. A non-volatile memory according to claim 36, wherein the floating gate is a side wall spacer adjacent said side wall of the auxiliary gate electrode, the second impurity diffusion layers of adjacent memory cells are contiguous, a second wiring is pulled out of the second impurity diffusion layer, and the floating gates of the memory cells are adjacent to each other through the second wiring.

44. A non-volatile memory according to claim 36, wherein the floating gate is a side wall spacer adjacent said side wall of the auxiliary gate electrode, the first impurity diffusion layers of adjacent memory cells are contiguous, and the auxiliary gate electrodes of the memory cells are continuously adjacent to each other.

45. A non-volatile memory having a memory cell, the memory cell comprising:

a semiconductor substrate having first and second impurity diffusion layers, a first insulating film on the semiconductor substrate between the first and second impurity diffusion layers and over at least a portion of said first impurity diffusion layer, a tunnel dielectric film over said second impurity diffusion layer, an auxiliary gate electrode on the first insulating film, a floating gate on the tunnel dielectric film and separated from a side wall of the auxiliary gate electrode by a side insulating film, one side of said floating gate being self-aligned with said side insulating film, a second insulating film covering at least said floating gate and at least a portion of said auxiliary gate electrode, and a control gate electrode on said second insulating film over said floating gate and over at least a portion of said auxiliary gate, and controlling the potential of the floating gate, wherein a plurality of memory cells are arranged in a matrix having a first group of cells aligned in a Y direction including first electrodes interconnected in the Y direction, a second group of cells aligned in an X direction and having adjacent first impurity diffusion layers commonly formed and the adjacent second impurity diffusion layers continuously formed, one of the first and second impurity diffusion layers is connected in the direction of X, and the other impurity diffusion layer is connected in the direction of Y.

46. A non-volatile memory according to claim 45, wherein the floating gate overlaps the second impurity diffusion layer through the tunnel dielectric film.

47. A non-volatile memory according to claim 45, wherein the floating gate is a self-aligned side wall spacer near said side wall of the auxiliary gate electrode.

48. A non-volatile memory according to claim 45, wherein the auxiliary gate electrode has a floating gate provided as a first side wall spacer over the second impurity diffusion layer and has a second side wall spacer over the first impurity diffusion layer, the second side wall spacer being formed simultaneously with the floating gate, and the second side wall spacer and the first impurity diffusion layer are connected.

49. A non-volatile memory according to claim 45, wherein the first wirings are pulled out of the second impurity diffusion layers of the memory cells, which are continuously provided in the direction of X, are connected to one another in the direction of X, and the first impurity diffusion layers of the memory cells, which are continuously provided in the direction of Y, are connected to one another through embedded diffusion layers in the direction of Y.

50. A non-volatile memory according to claim 45, wherein the first wirings pulled out of the second impurity diffusion layers of the memory cells, which are continuously provided in the direction of X, are connected to one another in the direction of X, the first impurity diffusion layers of the memory cells, which are continuously provided in the direction of Y, are connected to one another through the embedded diffusion layers in the direction of Y, the floating gate is provided as a side wall spacer near said side wall of the auxiliary gate electrode, and the side wall spacer comes into contact with the first impurity diffusion layer.

* * * * *